United States Patent
Kim et al.

(10) Patent No.: US 10,961,446 B2
(45) Date of Patent: Mar. 30, 2021

(54) QUANTUM DOTS, PRODUCTION METHODS THEREOF, AND LIGHT EMITTING DEVICE INCLUDING THE SAME

(71) Applicant: SAMSUNG ELECTRONICS CO., LTD., Suwon-si (KR)

(72) Inventors: Kwanghee Kim, Seoul (KR); Jaejun Chang, Gwacheon-si (KR); Oul Cho, Suwon-si (KR); Tae Hyung Kim, Seoul (KR); Sang Jin Lee, Seoul (KR); Eun Joo Jang, Suwon-si (KR); Young-soo Jeong, Suwon-si (KR); Moon Gyu Han, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/297,965

(22) Filed: Mar. 11, 2019

(65) Prior Publication Data
US 2019/0276734 A1    Sep. 12, 2019

(30) Foreign Application Priority Data

Mar. 9, 2018  (KR) .................. 10-2018-0028320
Mar. 8, 2019  (KR) .................. 10-2019-0027161

(51) Int. Cl.
*H01L 51/50*   (2006.01)
*C09K 11/02*   (2006.01)
(Continued)

(52) U.S. Cl.
CPC .......... *C09K 11/025* (2013.01); *C09K 11/883* (2013.01); *H01L 27/3244* (2013.01);
(Continued)

(58) Field of Classification Search
CPC .......... C09K 11/025; H01L 31/035218; H01L 51/502
See application file for complete search history.

(56) References Cited

U.S. PATENT DOCUMENTS

| 10,301,443 B2 * | 5/2019 | Lundorf .................. C04B 35/10 |
| 2006/0088713 A1 | 4/2006 | Dykstra et al. |

(Continued)

FOREIGN PATENT DOCUMENTS

| CN | 106566318 A | 4/2017 |
| CN | 106715643 A | 5/2017 |

(Continued)

OTHER PUBLICATIONS

C. Landes et al., "Observation of Large Changes in the Band Gap Absorption Energy of Small CdSe Nanoparticles Induced by the Adsorption of a Strong Hole Acceptor," Nano letters, Oct. 5, 2001, pp. 667-670, vol. 1, No. 11.

(Continued)

*Primary Examiner* — Nicholas J Tobergte
(74) *Attorney, Agent, or Firm* — Cantor Colburn LLP

(57) ABSTRACT

A quantum dot, and a light emitting device including the same is provided. The quantum dot includes a semiconductor nanocrystal and an organic ligand bound to the surface of the semiconductor nanocrystal, wherein the organic ligand includes a first ligand derived from a first thiol compound including a C12 or more aliphatic hydrocarbon group, and a second ligand derived from a second thiol compound including a C8 or less aliphatic hydrocarbon group.

21 Claims, 9 Drawing Sheets

(51) Int. Cl.
*C09K 11/88* (2006.01)
*H01L 27/32* (2006.01)
*B82Y 40/00* (2011.01)
*B82Y 20/00* (2011.01)

(52) U.S. Cl.
CPC ........ *H01L 51/502* (2013.01); *H01L 51/5056* (2013.01); *H01L 51/5072* (2013.01); *H01L 51/5088* (2013.01); *H01L 51/5092* (2013.01); *H01L 51/5096* (2013.01); *B82Y 20/00* (2013.01); *B82Y 40/00* (2013.01)

(56) References Cited

U.S. PATENT DOCUMENTS

| | | | |
|---|---|---|---|
| 2011/0140046 A1 | 6/2011 | Yu et al. | |
| 2018/0151817 A1* | 5/2018 | Cho | G02B 6/005 |
| 2019/0276733 A1* | 9/2019 | Mei | B01J 19/245 |
| 2019/0326539 A1* | 10/2019 | Chung | H01L 27/3244 |

FOREIGN PATENT DOCUMENTS

| | | |
|---|---|---|
| EP | 3172291 A1 | 5/2017 |
| JP | 6054062 B2 | 12/2016 |
| KR | 0971197 B1 | 7/2010 |
| KR | 1480475 B1 | 1/2015 |
| KR | 1486533 B1 | 2/2015 |
| KR | 1557498 B1 | 10/2015 |
| KR | 20150140720 A | 12/2015 |
| WO | 2016012433 A1 | 1/2016 |

OTHER PUBLICATIONS

Eunjoo Jang et al., "White-Light-Emitting Diodes with Quantum Dot Color Converters for Display Backlights," Advanced Materials, Jul. 21, 2010, pp. 3076-3080, vol. 22.

Margaret A Hines et al., "Colloidal PbS Nanocrystals with Size-Tunable Near-Infrared Emission: Observation of Post-Synthesis Self-Narrowing of the Particle Size Distribution," Advanced Materials, Nov. 4, 2003, pp. 1844-1849, vol. 15, Issue 21.

Mark C. Weidman et al., "Interparticle Spacing and Structural Ordering in Superlattice PbS Nanocrystal Solids Undergoing Ligand Exchange," Chemistry of Materials, Nov. 17, 2014, pp. 474-482, vol. 27.

N. S. Kurochkin et al., "Effect of the Length of Ligands Passivating Quantum Dots on the Electrooptical Characteristics of Organic Light," Semiconductors, Dec. 15, 2014, pp. 953-958, vol. 49, No. 7.

Robin R. Knauf et al., "Quantifying Ligand Exchange Reactions at CdSe Nanocrystal Surfaces," Chemistry of Materials, Jun. 29, 2016, pp. 4762-4770, vol. 28.

Seth Coe et al., "Electroluminescence from single monolayers of nanocrystals in molecular organic devices," Nature, Dec. 19, 2002, pp. 800-803, vol. 420.

Seth coe-Sullivan et al., "Tuning the performance of hybrid organic/inorganic quantum dot light-emitting devices," Organic Electronics, Sep. 2003, pp. 123-130, vol. 4, Issue 2-3.

Sirshendu Ghosh et al., "Effect of oleic acid ligand on photophysical, photoconductive and magnetic properties of monodisperse $SnO_2$ quantum dots," Dalton Transactions, The Royal Society of Chemistry, Nov. 7, 2012, pp. 3434-3446, vol. 42.

Stephen V. Kershaw et al., "Materials aspects of semiconductor nanocrystals for optoelectronic applications," Materials Horizons, Jan. 10, 2017, pp. 155-205, vol. 4.

Tae-Ho Kim et al., "Full-colour quantum dot displays fabricated by transfer printing," Nature Photonics, Feb. 20, 2011, pp. 176-182, vol. 5.

Zhaohan Li et al., "Efficient and long-life green light-emitting diodes comprising tridentate thiol capped quantum dots," Laser Photonics Reviews, Dec. 16, 2016, pp. 1-9 (1600227), vol. 11, Issue 1.

\* cited by examiner

QUANTUM DOTS, PRODUCTION METHODS THEREOF, AND LIGHT EMITTING DEVICE INCLUDING THE SAME

CROSS-REFERENCE TO RELATED APPLICATION

This application claims priority to and the benefit of Korean Patent Application Nos. 10-2018-0028320 and 10-2019-0027161, filed in the Korean Intellectual Property Office on Mar. 9, 2018, and Mar. 8, 2019, respectively, and all the benefits accruing therefrom under 35 U.S.C. § 119, the content of which is incorporated herein in its entirety by reference.

BACKGROUND

1. Field

A quantum dot and a light emitting device including the same are disclosed.

2. Description of the Related Art

Quantum dots (e.g., nano-sized semiconductor nanocrystals) may have different energy bandgaps by controlling the sizes and compositions of the quantum dots. Such quantum dots may emit light of various wavelengths. Quantum dots may be applied to various electronic devices including displays.

SUMMARY

An embodiment provides a quantum dot capable of simultaneously exhibiting dispersibility and improved electroluminescence properties or a quantum dot dispersion including the quantum dot.

An embodiment provides a light emitting device including the quantum dot.

An embodiment provides a display device including the light emitting device.

A quantum dot according to an embodiment includes a semiconductor nanocrystal and an organic ligand bound to a surface of the semiconductor nanocrystal, wherein the organic ligand includes a first ligand derived from a first thiol compound including a C12 or more (e.g., C12 to C40) aliphatic hydrocarbon group (e.g., an alkyl group, an alkenyl group, or an alkynyl group) and a second ligand derived from a second thiol compound including a C8 or less (e.g., C3 to C8) aliphatic hydrocarbon group (e.g., an alkyl group, an alkenyl group, or an alkynyl group).

The second thiol compound may not include a C9 or more aliphatic hydrocarbon group.

The aliphatic hydrocarbon group may include, e.g., be composed of, carbon and hydrogen or may include a methylene moiety replaced by a sulfonyl (—$SO_2$—) moiety, a carbonyl (CO) moiety, an ether (—O—) moiety, a sulfide (—S—) moiety, a sulfoxide (—SO—) moiety, an ester (—C(═O)O—) moiety, an amide (—C(═O)NR—) moiety including hydrogen or a C1 to C10 alkyl group, or a combination thereof.

The quantum dot may include a core including a first semiconductor nanocrystal and a shell disposed on the core, the shell including a second semiconductor nanocrystal including a different composition from a composition of the first semiconductor nanocrystal.

The first semiconductor nanocrystal and the second semiconductor nanocrystal may independently include a Group II-VI compound, a Group III-V compound, a Group IV-VI compound, a Group IV element or compound, a Group I-III-VI compound, a Group I-II-IV-VI compound, or a combination thereof.

The first thiol compound may include a compound represented by Chemical Formula 1:

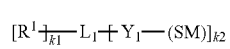

Chemical Formula 1 wherein, $R^1$ is hydrogen; a substituted or unsubstituted C1 to C30 linear or branched alkyl group; a substituted or unsubstituted C2 to C30 linear or branched alkenyl group; a substituted or unsubstituted C2 to C30 linear or branched alkynyl group; a substituted or unsubstituted C6 to C30 aryl group; a substituted or unsubstituted C7 to C30 arylalkyl group; a substituted or unsubstituted C3 to C30 cycloalkyl group; a C1 to C30 alkoxy group; a hydroxy group; —$NH_2$; a substituted or unsubstituted C1 to C30 amine group (—NRR', wherein, R and R' are independently hydrogen, or a C1 to C30 linear or branched alkyl group, provided that R and R' are not simultaneously hydrogen); an isocyanate group; a halogen; —ROR' (wherein R is a substituted or unsubstituted C1 to C20 alkylene group, and R' is hydrogen or a C1 to C20 linear or branched alkyl group); an acyl halide (—RC(═O)X, wherein R is a substituted or unsubstituted C1 to C30 alkylene group and X is a halogen); —C(═O)OR' (wherein R' is hydrogen or a C1 to C30 linear or branched alkyl group); —CN; —C(═O)ONRR' (wherein R and R' are independently hydrogen or a C1 to C20 linear or branched alkyl group), or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a substituted or unsubstituted C1 to C30 alkylene group or a substituted or unsubstituted C2 to C30 alkenylene group wherein a methylene (—$CH_2$—) moiety is replaced by a sulfonyl (—$SO_2$—) moiety, a carbonyl (CO) moiety, an ether (—O—) moiety, a sulfide (—S—) moiety, a sulfoxide (—SO—) moiety, an ester (—C(═O)O—) moiety, an amide (—C(═O)NR—) moiety wherein R is hydrogen or a C1 to C10 alkyl group, or a combination thereof, $Y_1$ is a single bond; —C(═S)—; a substituted or unsubstituted C1 to C30 alkylene group; a substituted or unsubstituted C2 to C30 alkenylene group; or a C1 to C30 alkylene group or a C2 to C30 alkenylene group wherein a methylene (—$CH_2$—) moiety is replaced by a sulfonyl (—S(═O)$_2$—) moiety, a carbonyl (—C(═O)—) moiety, an ether (—O—) moiety, a sulfide (—S—) moiety, a sulfoxide (—S(═O)—) moiety, an ester (—C(═O)O—) moiety, an amide (—C(═O)NR—) moiety including hydrogen or a C1 to C10 linear or branched alkyl group, an imine (—NR—) moiety wherein R is hydrogen or a C1 to C10 linear or branched alkyl group, or a combination thereof, M is hydrogen or a monovalent metal, k1 is 0 or an integer of 1 or greater, k2 is 1 or 2, provided that when k2 is 2, $Y_1$ is a single bond, and each SM moiety is bonded to an adjacent carbon atom in the $L_1$ moiety, a sum of k1 and k2 does not exceed the valence of $L_1$, and $R^1$, $L_1$, and $Y_1$ are selected such that the first thiol compound includes a C12 or more aliphatic hydrocarbon group (e.g., an alkyl group, an alkenyl group, or an alkynyl group).

The first thiol compound may include a C12 to C40 substituted or unsubstituted alkyl group (e.g., monothiol or cis-type dithiol), a C12 to C40 substituted or unsubstituted alkenyl group (e.g., monothiol or cis-type dithiol), a poly(ethyleneglycol)alkylether thiol, or a combination thereof.

The first thiol compound may include $R^1SH$ (wherein, $R^1$ is a C12 to C40 substituted or unsubstituted alkyl group, or a C12 to C40 substituted or unsubstituted alkenyl group), or a combination thereof.

The first thiol compound may include dodecane thiol, tetradecane thiol, hexadecane thiol, octadecane thiol, oleyl mercaptan, or a combination thereof.

The second thiol compound may include a compound represented by Chemical Formula 2:

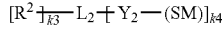

Chemical Formula 2 wherein, $R^2$ is hydrogen; a substituted or unsubstituted C1 to C8 linear or branched alkyl group; a substituted or unsubstituted C1 to C8 linear or branched alkenyl group; a substituted or unsubstituted C6 aryl group; a substituted or unsubstituted C3 to C8 cycloalkyl group; a C1 to C8 alkoxy group; a hydroxy group; —$NH_2$; a substituted or unsubstituted C1 to C8 amine group (—NRR', wherein R and R' are independently hydrogen or a C1 to C4 linear or branched alkyl group, provided that R and R' are not simultaneously hydrogen); an isocyanate group; a halogen; —ROR' (wherein R is a substituted or unsubstituted C1 to C7 alkylene group, and R' is hydrogen or a C1 to C7 linear or branched alkyl group); an acyl halide (—RC(=O)X, wherein, R is a substituted or unsubstituted C1 to C7 alkylene group, and X is a halogen); —C(=O)OR' (wherein R' is hydrogen, or a C1 to C7 linear or branched alkyl group); —CN; —C(=O)ONRR' (wherein, R and R' are independently hydrogen, or a C1 to C7 linear or branched alkyl group), or a combination thereof, $L_2$ is a carbon atom, a nitrogen atom, a substituted or unsubstituted C1 to C8 alkylene group, a substituted or unsubstituted C3 to C8 cycloalkylene group, a substituted or unsubstituted phenylene group, or a substituted or unsubstituted C1 to C8 alkylene group wherein a methylene (—$CH_2$—) moiety is replaced by a sulfonyl (—$SO_2$—) moiety, a carbonyl (CO) moiety, an ether (—O—) moiety, a sulfide (—S—) moiety, a sulfoxide (—SO—) moiety, an ester (—C(=O)O—) moiety, an amide (—C(=O)NR—) moiety wherein R is hydrogen or a C1 to C7 alkyl group, or a combination thereof, $Y_2$ is a single bond; —C(=S)—; a substituted or unsubstituted C1 to C7 alkylene group; a substituted or unsubstituted C2 to C7 alkenylene group; or a C1 to C7 alkylene group or a C2 to C7 alkenylene group wherein a methylene (—$CH_2$—) moiety is replaced by a sulfonyl (—S(=O)$_2$—) moiety, a carbonyl (—C(=O)—) moiety, an ether (—O—) moiety, a sulfide (—S—) moiety, a sulfoxide (—S(=O)—) moiety, an ester (—C(=O)O—) moiety, an amide (—C(=O)NR—) moiety wherein R is hydrogen or a C1 to C7 linear or branched alkyl group, an imine (—NR—) moiety wherein R is hydrogen or a C1 to C7 linear or branched alkyl group, or a combination thereof, M is hydrogen or a monovalent metal, k3 is 0 or an integer of 1 or greater, k4 is 1 or 2, provided that when k4 is 2, $Y_2$ is a single bond, and each SM moiety is bonded to an adjacent carbon atom in the $L_1$ moiety, a sum of k3 and k4 does not exceed the valence of $L_2$, and $R^2$, $L_2$, and $Y_2$ are independently selected such that the second thiol compound includes a C8 or less aliphatic hydrocarbon group.

The second thiol compound may include a C3 to C8 substituted or unsubstituted alkyl group (e.g., monothiol or cis-type dithiol), a C3 to C8 substituted or unsubstituted alkenyl group (e.g., monothiol or cis-type dithiol), or a combination thereof.

The second thiol compound may include $R^1SH$ (wherein, $R^1$ is a C3 to C8 substituted or unsubstituted alkyl group, or a C3 to C8 substituted or unsubstituted alkenyl group), or a combination thereof.

The second thiol compound may include a butane thiol, a pentane thiol, a hexane thiol, a heptane thiol, an octane thiol, 2-(2-methoxyethoxy)ethane thiol, 3-methoxybutyl 3-mercaptopropinonate, 3-methoxybutylmercaptoacetate, thioglycolic acid, 3-mercaptopropionic acid, thiopronine, 2-mercaptopropionic acid, 2-mercaptopropinonate, 2-mercaptoethanol, 1-thioglycerol, mercaptosuccinic acid, L-cysteine, 2-(dimethylamino)ethanethiol, 5-mercaptomethyltetrazole, 2,3-dimercapto-1-propanol, glutathione, diethyldithiocarbamate, or a combination thereof.

The first thiol compound may not include a carboxylic acid moiety and the second thiol compound may not include a carboxylic acid moiety.

The quantum dot may further include a third ligand derived from RC(=O)OH, RC(=O)OM', $RNH_2$, $R_2NH$, $R_3N$, $R_3PO$, $R_3P$, ROH, RP(=O)(OH)$_2$, $R_2P$(=O)OH, (wherein, each R is independently a substituted or unsubstituted C5 to C24 alkyl group, a substituted or unsubstituted C5 to C24 alkenyl group, or a substituted or unsubstituted C5 to C20 aryl group, and M' is a monovalent metal, for example, a Group 1 element, such as, for example, Na), or a combination thereof, and the third ligand may be present in an amount of less than about 5 weight percent (wt %), based on a total weight of the quantum dot.

In the quantum dot, the amount of the third ligand may be less than or equal to about 1 wt %, based on a total weight of the quantum dot.

A total amount of an organic substance present in the quantum dot may be less than about 20 wt %, as measured by a thermogravimetric analysis.

The quantum dot may be dispersed in an organic solvent including a halogenated hydrocarbon solvent, a C6 to C40 substituted or unsubstituted aromatic hydrocarbon solvent, a C3 to C40 substituted or unsubstituted aliphatic hydrocarbon solvent, a C1 to C10 alcohol, or a combination thereof to form a transparent solution.

The quantum dot may further include a polyvalent metal compound or a moiety derived therefrom on a surface of the quantum dot.

The polyvalent metal compound may include zinc, indium, or a combination thereof.

The polyvalent metal compound may include a (meth)acrylate moiety, RCOO— (R is a C10 or less aliphatic hydrocarbon group), a halide, or a combination thereof.

The polyvalent metal compound may include zinc chloride, zinc bromide, zinc iodide, indium chloride, zinc (meth)acrylate, zinc propinonate, or a combination thereof.

In an embodiment, a light emitting device includes a first electrode and a second electrode facing each other; and an emission layer disposed between the first electrode and the second electrode, the emission layer including the aforementioned quantum dot (e.g., a plurality of quantum dots).

The light emitting device may further include a hole injecting layer (HIL), a hole transport layer (HTL), an electron blocking layer (EBL), or a combination thereof between the first electrode and the emission layer.

The light emitting device may further include an electron injecting layer (EIL), an electron transport layer (ETL), a hole blocking layer (HBL), or a combination thereof between the second electrode and the emission layer.

An embodiment provides a display device including the light emitting device (e.g., electroluminescent device).

The quantum dot according to an embodiment may exhibit improved photoluminescence properties in an electroluminescent device while maintaining dispersion stability in an organic medium. The quantum dot according to an embodiment may form a layer including one or more monolayers by a solution process. The light emitting device including the quantum dot according to an embodiment may exhibit improved electroluminescence properties, such as, for example, improved external quantum efficiency and maximum brightness.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
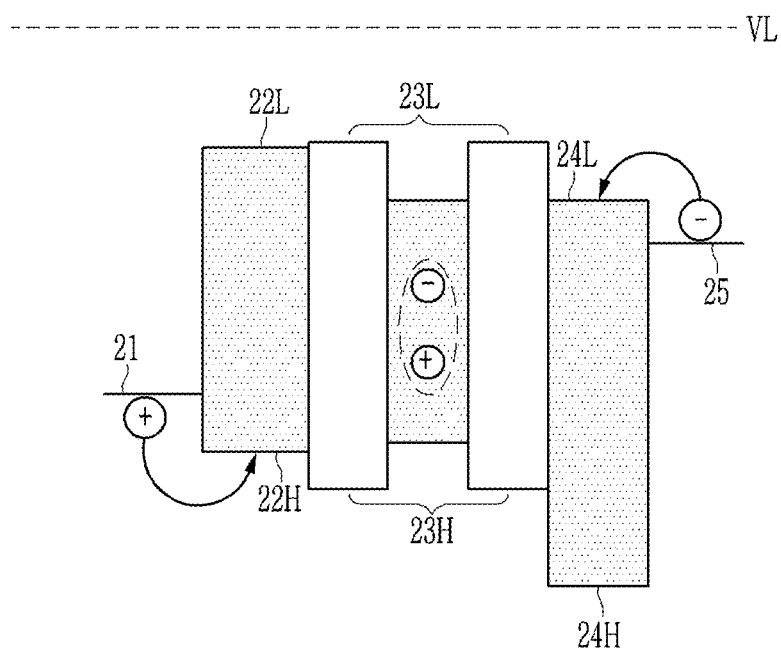
FIG. 1 is a view schematically showing energy levels of each layer in a light emitting device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to the case in which in a compound or a functional group, hydrogen is replaced by a C1 to C30 an alkyl group, a C2 to C30 alkenyl, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "(meth)acrylate" refers to acrylate, methacrylate, or a combination thereof.

As used herein, when a definition is not otherwise provided, "Group" in the term Group III, Group II, and the like refers to a group of Periodic Table.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group II" refers to Group IIA and Group IIB, and examples of Group II metal may be Cd, Zn, Hg, and Mg, but are not limited thereto.

As used herein, when a definition is not otherwise provided, "Group III" refers to Group IIIA and Group IIIB, and examples of Group III metal may be Al, In, Ga, and Tl, but are not limited thereto.

As used herein, when a definition is not otherwise provided, "Group IV" refers to Group IVA and Group IVB, and examples of a Group IV metal may be Si, Ge, and Sn, but are not limited thereto. As used herein, "metal" may include a semi-metal, such as, for example, Si.

As used herein, when a definition is not otherwise provided, "Group V" refers to Group VA, and examples may include nitrogen, phosphorus, arsenic, antimony, and bismuth, but are not limited thereto.

As used herein, when a definition is not otherwise provided, "Group VI" refers to Group VIA, and examples may include sulfur, selenium, tellurium, but are not limited thereto.

As used herein, when a definition is not otherwise provided, "aliphatic hydrocarbon group" refers to an organic group including carbon and hydrogen atoms, and includes an (linear, branched, or cyclic) alkyl group, alkenyl group, alkynyl group, or a combination thereof which is straight chain, branched, or cyclic. As used herein, a methylene moiety of the "aliphatic hydrocarbon group" may be replaced by a sulfonyl (—SO$_2$—) moiety, a carbonyl (CO) moiety, an ether (—O—) moiety, a sulfide (—S—) moiety, a sulfoxide (—SO—) moiety, an ester (—C(=O)O—) moiety, an amide (—C(=O)NR—) moiety (wherein R is hydrogen or a C1 to C10 alkyl group), or a combination thereof.

As used herein, when a definition is not otherwise provided, "alkoxy" means an alkyl group that is linked via an oxygen (i.e., alkyl-O—), for example methoxy, ethoxy, and sec-butyloxy groups.

As used herein, when a definition is not otherwise provided, "alkyl" means a straight or branched chain, saturated, monovalent hydrocarbon group (e.g., methyl or hexyl).

As used herein, when a definition is not otherwise provided, "alkylene" means a straight or branched chain, saturated, divalent aliphatic hydrocarbon group, (e.g., methylene (—CH2-) or, propylene (—(CH2)3-)).

As used herein, when a definition is not otherwise provided, "alkynyl" means a straight or branched chain, monovalent hydrocarbon group having at least one carbon-carbon triple bond (e.g., ethynyl).

As used herein, when a definition is not otherwise provided, "amine group" has the general formula —NRR, wherein each R is independently hydrogen, a C1-C12 alkyl group, a C7-C20 alkylarylene group, a C7-C20 arylalkylene group, or a C6-C18 aryl group.

As used herein, when a definition is not otherwise provided, "arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, when a definition is not otherwise provided, "aromatic" means an organic compound or group comprising at least one unsaturated cyclic group having delocalized pi electrons. The term encompasses both hydrocarbon aromatic compounds and heteroaromatic compounds.

As used herein, when a definition is not otherwise provided, "aryl" means a monovalent group formed by the removal of one hydrogen atom from one or more rings of an arene (e.g., phenyl or naphthyl).

As used herein, when a definition is not otherwise provided, "arylalkyl" means a substituted or unsubstituted aryl group covalently linked to an alkyl group that is linked to a compound (e.g., a benzyl is a C7 arylalkyl group).

As used herein, when a definition is not otherwise provided, "cycloalkenyl" means a monovalent group having one or more rings and one or more carbon-carbon double bond in the ring, wherein all ring members are carbon (e.g., cyclopentyl and cyclohexyl).

As used herein, when a definition is not otherwise provided, "cycloalkyl" means a monovalent group having one or more saturated rings in which all ring members are carbon (e.g., cyclopentyl and cyclohexyl).

As used herein, when a definition is not otherwise provided, "cycloalkynyl" means a stable aliphatic monocyclic or polycyclic group having at least one carbon-carbon triple bond, wherein all ring members are carbon (e.g., cyclohexynyl).

As used herein, when a definition is not otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, when a definition is not otherwise provided, the prefix "hetero" means that the compound or group includes at least one heteroatom (e.g., 1, 2, or 3 heteroatom(s)), wherein the heteroatom(s) is each independently N, O, S, Si, or P.

As used herein, when a definition is not otherwise provided, "heteroalkyl" is an alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, when a definition is not otherwise provided, "ketone" refers to a C2 to C30 ketone group, and specifically a C2 to C18 ketone group. Ketone groups have the indicated number of carbon atoms, with the carbon of the keto group being included in the numbered carbon atoms. For example a C2 ketone group is an acetyl group having the formula CH3(C=O)—.

A quantum dot (e.g., semiconductor nanocrystal particle) may have a theoretical quantum yield (QY) of 100%, and emit light having a high color purity (e.g., having a full width at half maximum (FWHM) of less than or equal to about 40 nanometers (nm)). The quantum dot may enhance a luminous efficiency and improve color reproducibility in an application as a light emitting material. An electroluminescent display device is a display device capable of being driven, e.g., operated, without an external light source. The electroluminescent display device includes a light emitting device including an electroluminescent material. Electrons and holes injected from the first and second electrodes combine in the emission layer to form an exciton, which emits light while emitting energy.

In an embodiment, energy levels of a light emitting device having a quantum dot emission layer are shown in FIG. 1. FIG. 1 shows energy levels (electronsvolts (eV)) with reference to a vacuum level (VL), and "work function" means energy to migrate a charge at a Fermi level to a vacuum level (VL). The HOMO (highest occupied molecular orbital) energy level of each layer is represented as "H", and the LUMO (lowest unoccupied molecular orbital) energy level is denoted as "L."

The light emitting device of FIG. 1 includes a first electrode 21, a hole transport/injecting layer 22 (including LUMO 22L), an emission layer 23, an electron transport/injecting layer 24 (including HOMO 24H), and a second electrode 25. With reference to FIG. 1, a hole is injected from the first electrode (e.g., indium tin oxide (ITO)), passes HOMO 22H of the hole transport layer (HTL), and reaches HOMO 23H of the emission layer. An electron is injected from the second electrode (e.g., Al), passes the electron transport layer (ETL) 24L, and reaches LUMO 23L of the emission layer. The hole and the electron are recombined in the emission layer and emit light.

A device including a quantum dot-based emission layer may have a higher color purity of light as the quantum dot exhibits an improved luminous efficiency and a narrower luminescence spectrum than an organic light emitting material. The organic ligand present on the surface of the quantum dot may provide the dispersion stability of, e.g., to, the quantum dot in an organic solvent in the manufacturing process and contribute to the reduction of surface defects. Surface defects at the quantum dots may result in non-luminescent transition. To prevent the precipitation of quantum dots in a solution, the quantum dot may include an organic ligand in an amount above a threshold. However, an organic ligand, which is an insulator in a light emitting device, may act as a barrier to electrons and holes and may cause a reduction in luminous efficiency. The quantum dot of an embodiment may realize, e.g., exhibit, improved luminous efficiency in an electroluminescent device while maintaining dispersion stability.

The quantum dot according to an embodiment includes a semiconductor nanocrystal and an organic ligand bound to the surface of the semiconductor nanocrystal, wherein the organic ligand includes a first ligand derived from a first thiol compound having C12 or more (e.g., C12 to C40) aliphatic hydrocarbon group (e.g., an alkyl group, an alkenyl group, or an alkynyl group), and a second ligand derived from a second thiol compound including C8 or less (e.g., C3 to C8) aliphatic hydrocarbon group (e.g., an alkyl group, an alkenyl group, or an alkynyl group). The quantum dot may not include a heavy metal, such as, for example, cadmium, mercury, lead, or a combination hereof.

Figure 2:
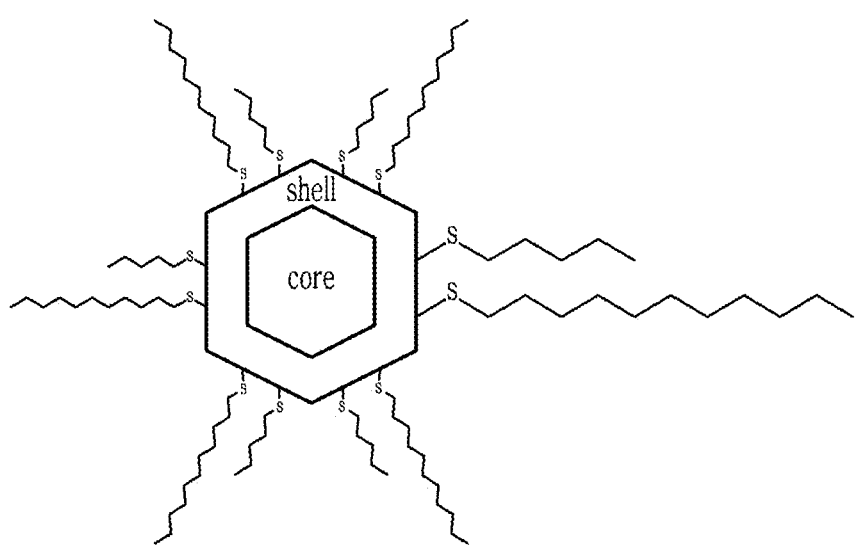
FIG. 2 is a schematic view of a quantum dot according to an embodiment.

A quantum dot according to an embodiment is described referring to FIG. 2. Referring to FIG. 2, the quantum dot includes a semiconductor nanocrystal, and a long-chain ligand and a short-chain ligand that are bound to the surface of the semiconductor nanocrystal. The semiconductor nanocrystal may have a core-shell structure as described below. The long-chain ligand may be derived from a first thiol compound having a C12 or more organic group (e.g., an aliphatic hydrocarbon group). The short-chain ligand may be derived from a second thiol compound having a C8 or less organic group (e.g., an aliphatic hydrocarbon group). The second thiol compound may not include a C9 or more aliphatic hydrocarbon group (e.g., an alkyl group, an alkenyl group, or an alkynyl group).

The quantum dot may have a core-shell structure including a core including a first semiconductor nanocrystal, and a shell disposed on the core and including a second semiconductor nanocrystal. The second semiconductor nanocrystal may have a different composition from the first semiconductor nanocrystal. Herein, the semiconductor nanocrystal may refer to a nanocrystal compound without a ligand.

The semiconductor nanocrystal (e.g., the first semiconductor nanocrystal, the second semiconductor nanocrystal, or a combination thereof) may include a Group II-VI compound, a Group III-V compound, a Group IV-VI compound, a Group IV element or compound, a Group I-III-VI compound, a Group I-II-IV-VI compound, or a combination thereof.

The Group II-VI compound may include a binary element compound including CdSe, CdTe, ZnS, ZnSe, ZnTe, ZnO, HgS, HgSe, HgTe, MgSe, MgS or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal.

The Group III-V compound may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound including GaAlNP, GaAlNAs, GaAlNSb, GaAlPAs, GaAlPSb, GalnNP, GaInNAs, GaInNSb, GaInPAs, GaInPSb, InAlNP, InAlNAs, InAlNSb, InAlPAs, InAlPSb, or a combination thereof. The Group III-V compound may further include a Group II element. Example of such a semiconductor nanocrystal may include InZnP.

The Group IV-VI compound may include a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, and a mixture thereof.

Examples of the Group I-III-VI compound may include $CuInSe_2$, $CuInS_2$, CuInGaSe, or CuInGaS, but are not limited thereto.

Examples of the Group I-II-IV-VI compound may include CuZnSnSe or CuZnSnS, but are not limited thereto.

The Group IV element or compound may include a single-element including Si, Ge, or a combination thereof; or a binary element compound including SiC, SiGe, or a combination thereof.

The binary element compound, the ternary element compound, or the quaternary element compound may be respectively included in the particle at a uniform concentration or at partially different concentrations. The quantum dot may include a core including a first semiconductor nanocrystal and a shell disposed on at least a portion (or the entirety) of a surface of the core and including a second semiconductor nanocrystal having a different composition from that of the first semiconductor nanocrystal. On the interface between the core and the shell, an alloyed interlayer may be present or may not be present. The alloyed layer may include a homogeneous alloy or may have a concentration gradient. The gradient alloy may have a concentration gradient wherein a concentration of an element of the shell radially changes (e.g., decreases or increases toward the core). In addition, the shell may include a multi-layered shell having at least two layers wherein adjacent layers, e.g., two adjacent layers, have different compositions from each other. In the multi-layered shell, a layer may include a semiconductor nanocrystal having a single composition. In the multi-layered shell, a layer may have an alloyed semiconductor nanocrystal. In the multi-layered shell, a layer may have a concentration gradient that radially changes in light of a composition of a semiconductor nanocrystal.

In the core-shell quantum dot, the materials of the shell may have a bandgap energy that is larger than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (layers that are closer to the core). In the case of the multi-layered shell, a semiconductor nanocrystal of each layer is selected to have an appropriate bandgap, thereby effectively showing, e.g., exhibiting, a quantum confinement effect.

The light emitting wavelength of the semiconductor nanocrystal is not particularly limited and may be selected appropriately. For example, a photoluminescence peak maximum peak wavelength of the semiconductor nanocrystal may be present in a range from an ultraviolet region to a near infrared region. The photoluminescence peak maximum wavelength of the semiconductor nanocrystal may be present within a range from about 420 nm to about 750 nm. In the case of a green light emitting semiconductor nanocrystal, the green light emitting semiconductor nanocrystal may exhibit a photoluminescence peak maximum wavelength of greater than or equal to about 500 nm, for example, greater than or equal to about 510 nm and less than or equal to about 550 nm. In the case of a red light emitting semiconductor nanocrystal, the red light emitting semiconductor nanocrystal may exhibit a photoluminescence peak maximum wavelength of greater than or equal to about 600 nm, for example, greater than or equal to about 610 nm, and less than or equal to about 650 nm. In the case of a blue light emitting semiconductor nanocrystal, the blue light emitting semiconductor nanocrystal may exhibit a photoluminescence peak maximum wavelength of about 450 nm to about 470 nm.

The semiconductor nanocrystal may exhibit a photoluminescence spectrum having a relatively narrow full width at half maximum (FWHM). In an embodiment, the semiconductor nanocrystal may have a full width at half maximum (FWHM) of less than or equal to about 45 nm, for example less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm, in a photoluminescence spectrum of the semiconductor nanocrystal. The quantum dot may have a quantum yield of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The semiconductor nanocrystal may have a size (e.g., a diameter of a particle, or in the case of a non-spherically shaped particle, a diameter calculated from a two dimensional area determined in an electron microscopic analysis) of about 1 nm to about 100 nm. In an embodiment, the semiconductor nanocrystal may have a size of about 1 nm to about 50 nm, for example, from about 2 nm (or from about 3 nm) to about 35 nm. In an embodiment, the semiconductor nanocrystal may have a size of greater than or equal to about 1 nm, greater than or equal to about 2 nm, greater than or equal to about 3 nm, greater than or equal to about 4 nm, or greater than or equal to about 5 nm. In an embodiment, the semiconductor nanocrystal may have a size of less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The semiconductor nanocrystal may have any suitable shape. In an embodiment, the semiconductor nanocrystal may have a spherical shape, a polyhedral shape, a pyramidal shape, a multi-pod, a cubic shape, a nanotube, a nanowire, a nanofiber, a nanosheet, a nanoplate, or a combination thereof.

The semiconductor nanocrystal may be synthesized in any suitable method. For example, several nano-sized semiconductor nanocrystal may be synthesized by a wet chemical process. In the wet chemical process, precursor materials react in an organic solvent to grow nanocrystal particles, and the organic solvent or a ligand compound may coordinate (or be bound) to the surface of the semiconductor nanocrystal, thereby controlling a growth of the nanocrystal. The semiconductor nanocrystal may be recovered by pouring an excess amount of a non-solvent to a reaction solution including the quantum dot in order to remove extra organic substances that are not coordinated, e.g., bound, to a surface of the semiconductor nanocrystal and centrifuging the resulting mixture. Examples of the non-solvent may include acetone, ethanol, methanol, and the like, but are not limited thereto.

The recovered semiconductor nanocrystals may include an organic substance (e.g., organic ligand) bound to the surface and an amount of the organic substance may be greater than or equal to about 5 wt % and less than or equal to about 35 wt % based on a total weight of the quantum dot. For the dispersibility of the quantum dot, an amount of the aforementioned organic substance may desirably increase up to at least 10 wt %. However, according to the studies of the present inventors, as the amount of the aforementioned organic substances increases, the amount of the aforementioned organic substances may result in a reduction in luminous efficiency as the organic substances may have an effect, e.g., act, as a barrier to the injection of electrons and holes.

The quantum dot according to an embodiment is modified to have an organic ligand bound to the surface which includes a first ligand derived from a first thiol compound having a long-chain aliphatic hydrocarbon group, and a second ligand derived from a second thiol compound having a relatively short-chain (C8 or less) aliphatic hydrocarbon group. It is possible to exhibit improved electroluminescence properties while exhibiting dispersibility even at a reduced amount of the organic substance.

The first thiol compound and the second thiol compound may include a monothiol (or monothiolate) having one thiol group, dithiol (or dithiolate), or a derivative thereof, wherein each thiol group is bonded to an adjacent carbon atom (i.e., disposed in a cis-type configuration).

The first thiol compound may include a compound represented by Chemical Formula 1.

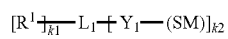

Chemical Formula 1 wherein, $R^1$ is hydrogen; a substituted or unsubstituted C1 to C30 linear or branched alkyl group; a substituted or unsubstituted C2 to C30 linear or branched alkenyl group; a substituted or unsubstituted C1 to C30 linear or branched alkynyl group; a substituted or unsubstituted C6 to C30 aryl group; a substituted or unsubstituted C7 to C30 arylalkyl group; a substituted or unsubstituted C3 to C30 cycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group, provided that R and R' are not simultaneously hydrogen); an isocyanate group, a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted C1 to C20 alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group), or a combination thereof, $L_1$ is a carbon atom, a nitrogen atom, a substituted or unsubstituted C1 to C30 alkylene group, a substituted or unsubstituted C1 to C30 alkenylene group, a substituted or unsubstituted C3 to C30 cycloalkylene group, a substituted or unsubstituted C6 to C30 arylene group, or a substituted or unsubstituted C1 to C30 alkylene group or a substituted or unsubstituted C2 to C30 alkenylene group wherein a methylene (—$CH_2$—) moiety is replaced by a sulfonyl (—$SO_2$—) moiety, a carbonyl (CO) moiety, an ether (—O—) moiety, a sulfide (—S—) moiety, a sulfoxide (—SO—) moiety, an ester (—C(=O)O—) moiety, an amide (—C(=O)NR—) moiety (wherein R is hydrogen or a C1 to C10 alkyl group), or a combination thereof, $Y_1$ is a single bond; —C(=S)—; a substituted or unsubstituted C1 to C30 alkylene group; a substituted or unsubstituted C2 to C30 alkenylene group; or a C1 to C30 alkylene group or a C2 to C30 alkenylene group wherein a methylene (—$CH_2$—) moiety is replaced by a sulfonyl (—$S(=O)_2$—) moiety, a carbonyl (—C(=O)—) moiety, an ether (—O—) moiety, sulfide (—S—), a sulfoxide (—S(=O)—) moiety, an ester (—C(=O)O—) moiety, an amide (—C(=O)NR—) moiety (wherein R is hydrogen or a C1 to C30 linear or branched alkyl group), an imine (—NR—) moiety (wherein R is hydrogen or a C1 to C30 linear or branched alkyl group), or a combination thereof, M is hydrogen or a monovalent metal, k1 is 0 or an integer of 1 or greater, k2 is 1 or 2, provided that when k2 is 2, $Y_1$ is a single bond and each SM moiety is bonded to an adjacent carbon atom in the $L_1$ moiety, a sum of k1 and k2 does not exceed the valence of $L_1$, and $R^1$, $L_1$, and $Y_1$ are selected such that the first thiol compound has a C12 or more aliphatic hydrocarbon group (e.g., an alkyl group, an alkenyl group, or an alkynyl group).

The first thiol compound may include a compound represented by Chemical Formula 1-1, a compound represented by Chemical Formula 1-2, or a combination thereof.

RSM                             Chemical Formula 1-1 wherein, R is a substituted or unsubstituted linear or branched C12 or more (e.g., C14 or more, C16 or more, or C18 or more, and C40 or less, C36 or less, C30 or less, or C24 or less) aliphatic hydrocarbon group (e.g., an alkyl group, an alkenyl group, or an alkynyl group), and M is hydrogen, or a monovalent metal, for example a Group 1 element, such as, lithium, sodium (Na), potassium,

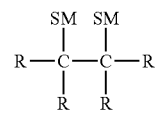

Chemical Formula 1-2 wherein, each R is independently hydrogen, a C1 to C10 hydrocarbon group (e.g., an alkyl group, such as, a methyl group, or an ethyl group), or a substituted or unsubstituted linear or branched C11 or more (e.g., C14 or more, C16 or more, or C18 or more, and C40 or less, C36 or less, C30 or less, or C24 or less) aliphatic hydrocarbon group (e.g., an alkyl group, an alkenyl group, or an alkynyl group), provided that at least one R is a substituted or unsubstituted linear or branched C11 or more aliphatic hydrocarbon group, and M is hydrogen, or a monovalent metal, for example, a Group 1 element, such as lithium, sodium (Na), or potassium.

The first thiol compound may include a thiol having a C12 to C40 substituted or unsubstituted alkyl group (e.g., monothiol or cis-type dithiol), a thiol having a C12 to C40 substituted or unsubstituted alkenyl group (e.g., monothiol or cis-type dithiol), a poly(ethyleneglycol)alkylether thiol, or a combination thereof.

The first thiol compound may include dodecane thiol, tetradecane thiol, hexadecane thiol, octadecane thiol, oleyl mercaptan, or a combination thereof.

While not wishing to be bound by any theory, it is believed that the first ligand derived from the first thiol compound may contribute to dispersibility of the quantum dot.

The second thiol compound may include a compound represented by Chemical Formula 2:

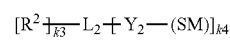

Chemical Formula 2 wherein, $R^2$ is hydrogen; a substituted or unsubstituted C1 to C8 linear or branched alkyl group; a substituted or unsubstituted C1 to C8 linear or branched alkenyl group; a substituted or unsubstituted C6 aryl group; a substituted or unsubstituted C3 to C8 cycloalkyl group; a C1 to C8 alkoxy group; a hydroxy group; —NH$_2$; a substituted or unsubstituted C1 to C8 amine group (—NRR', wherein R and R' are independently hydrogen, or a C1 to C4 linear or branched alkyl group, provided that R and R' are not simultaneously hydrogens); an isocyanate group, a halogen; —ROR' (wherein R is a substituted or unsubstituted C1 to C7 alkylene group, and R' is hydrogen, or a C1 to C7 linear or branched alkyl group); an acyl halide (—RC(=O)X, wherein R is a substituted or unsubstituted C1 to C7 alkylene group, and X is a halogen); —C(=O)OR' (wherein R' is hydrogen, or a C1 to C7 linear or branched alkyl group); —CN; —C(=O)ONRR' (wherein R and R' are independently hydrogen, or a C1 to C7 linear or branched alkyl group), or a combination thereof, L$_2$ is a carbon atom, a nitrogen atom, a substituted or unsubstituted C1 to C8 alkylene group, a substituted or unsubstituted C3 to C8 cycloalkylene group, or a substituted or unsubstituted phenylene group, or a substituted or unsubstituted C1 to C8 alkylene group wherein a methylene (—CH$_2$—) moiety is replaced by a sulfonyl (—SO$_2$—) moiety, a carbonyl (CO) moiety, an ether (—O—) moiety, a sulfide (—S—) moiety, a sulfoxide (—SO—) moiety, an ester (—C(=O)O—) moiety, an amide (—C(=O)NR—) moiety (wherein R is hydrogen or a C1 to C7 alkyl group), or a combination thereof, Y$_2$ is a single bond; —C(=S)—; a substituted or unsubstituted C1 to C7 alkylene group; a substituted or unsubstituted C2 to C7 alkenylene group; or a C1 to C7 alkylene group or a C2 to C7 alkenylene group wherein a methylene (—CH$_2$—) moiety is replaced by a sulfonyl (—S(=O)$_2$—) moiety, a carbonyl (—C(=O)—) moiety, an ether (—O—) moiety, a sulfide (—S—) moiety, a sulfoxide (—S(=O)—) moiety, an ester (—C(=O)O—) moiety, an amide (—C(=O)NR—) moiety (wherein R is hydrogen or a C1 to C7 linear or branched alkyl group), an imine (—NR—) moiety (wherein R is hydrogen or a C1 to C7 linear or branched alkyl group), or a combination thereof, M is hydrogen or a monovalent metal, k3 is 0 or an integer of 1 or greater, k4 is 1 or 2, provided that when k4 is 2, Y$_2$ is a single bond, and each SM moiety is bonded to an adjacent carbon atom in the L$_1$ moiety, a sum of k3 and k4 does not exceed the valence of L$_2$, and R$^2$, L$_2$, and Y$_2$ are independently selected such that the second thiol compound includes a C8 or less aliphatic hydrocarbon group.

The second thiol compound may include a compound represented by Chemical Formula 2-1, a compound represented by Chemical Formula 2-2, or a combination thereof:

RSM          Chemical Formula 2-1 wherein R is a substituted or unsubstituted linear or branched C3 to C8 aliphatic hydrocarbon group (e.g., an alkyl group, an alkenyl group, or an alkynyl group), and M is hydrogen, or a monovalent metal, for example, a Group 1 element, such as, lithium, sodium (Na), or potassium,

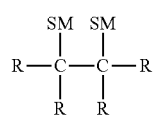

Chemical Formula 2-2 wherein each R is independently hydrogen, or an unsubstituted linear or branched C1 to C7 aliphatic hydrocarbon group (e.g., an alkyl group, an alkenyl group, or an alkynyl group), provided at least one R is an unsubstituted linear or branched C2 to C7 aliphatic hydrocarbon group, and M is hydrogen, or a monovalent metal, for example, a Group 1 element such as lithium, sodium (Na), or potassium.

The second thiol compound may include a thiol having a C3 to C8 substituted or unsubstituted alkyl group (e.g., monothiol or cis-type dithiol), a thiol having a C3 to C8 substituted or unsubstituted alkenyl group (e.g., monothiol or cis-type dithiol), or a combination thereof.

The second thiol compound may include a butane thiol, a pentane thiol, a hexane thiol, a heptane thiol, an octane thiol, 2-(2-methoxyethoxy)ethane thiol, 3-methoxybutyl 3-mercaptopropinonate, 3-methoxybutyl mercaptoacetate, thioglycolic acid, 3-mercaptopropionic acid, thiopronine, 2-mercaptopropionic acid, 2-mercaptopropinonate, 2-mercaptoethanol, 1-thioglycerol, mercaptosuccinic acid, L-cysteine, 2-(dimethylamino)ethanethiol, 5-mercaptomethyltetrazole, 2,3-dimercapto-1-propanol, glutathione, diethyldithiocarbamate, or a combination thereof.

The first thiol compound and the second thiol compound may not include a carboxylic acid moiety.

An amount of the first ligand may be greater than or equal to about 1 wt %, greater than or equal to about 2 wt %, greater than or equal to about 3 wt %, greater than or equal to about 4 wt %, greater than or equal to about 5 wt %, or greater than or equal to about 6 wt %, based on a total weight of the quantum dot. The amount of the first ligand may be less than or equal to about 15 wt %, less than or equal to about 12 wt %, less than or equal to about 10 wt %, less than or equal to about 9 wt %, less than or equal to about 8 wt %, or less than or equal to about 7 wt %, based on a total weight of the quantum dot. An amount of the second ligand may be greater than or equal to about 1 wt %, greater than or equal to about 2 wt %, or greater than or equal to about 3 wt %, based on a total weight of the quantum dot.

The amount of the second ligand may be less than or equal to about 15 wt %, less than or equal to about 12 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight of the quantum dot.

A sum amount of the first ligand and the second ligand may be less than or equal to about 20 wt %, less than or equal to about 15 wt %, less than or equal to about 14 wt %, less than or equal to about 13 wt %, or less than or equal to about 12 wt %, based on a total weight of the quantum dot. The sum amount of the first ligand and the second ligand may be greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 12 wt %, or greater than or equal to about 15 wt %, based on a total weight of the quantum dot. An amount of the second ligand may be greater than or equal to about 0.1 moles (or greater than or equal to about 0.2 moles, greater than or equal to about 0.3 moles, greater than or equal to about 0.4 moles, or greater than or equal to about 0.5 moles), and less than or equal to about 1 mole (or less than or equal to about 0.9 moles, less than or equal to about 0.8 moles, or less than or equal to about 0.7 moles), relative to 1 mole of the first ligand.

The quantum dot may include a third ligand derived from a compound represented by RCOOH (wherein, R is C12 or more, for example, C14 or more, or C20 or more alkyl group, or a C12 or more alkenyl group), a compound represented by RNH$_2$ (wherein, R is C12 or more, for example, C14 or more, or C20 or more alkyl group, or a C12 or more alkenyl group), or a combination thereof, in a limited amount. In an embodiment, an amount of the third ligand, when confirmed by a thermogravimetric analysis, may be less than or equal to about 10 wt %, less than or equal to about 9 wt %, less than or equal to about 8 wt %, less than or equal to about 7 wt %, less than or equal to about 6 wt %, or less than or equal to about 5 wt %, based on a total mole amount of the organic substance of the quantum dot. In the quantum dot, the amount of the third ligand, when confirmed by a thermogravimetric analysis, may be less than or equal to about 5 wt %, less than or equal to about 4 wt %, less than or equal to about 3 wt %, less than or equal to about 2 wt %, less than or equal to about 1 wt %, or less than or equal to about 0.9 wt %, based on a total amount of the quantum dot.

In the quantum dot according to an embodiment, the presence and amounts of the first ligand, the second ligand, and the third ligand may be confirmed by a thermogravimetric analysis of the quantum dot. When a derivative weight loss curve is obtained from a thermogravimetric analysis (TGA) of the quantum dot according to an embodiment, an intensity and area of a peak of a maximum peak (hereinafter referred to as a first peak) in the temperature range of 400° C. or greater in the curve may represent a presence and an amount of the third ligand. When a derivative weight loss curve is obtained from a thermogravimetric analysis (TGA) of the quantum dot according to an embodiment, an intensity and area of a maximum peak (hereinafter, a second peak) in the temperature range of less than 400° C. of the curve may represent a presence and an amount of the first and second ligands.

In the derivative weight loss curve of the quantum dot according to an embodiment, a ratio of an intensity of the first peak relative to the second peak may be less than about 1:1, for example, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, or less than or equal to about 0.1:1.

The quantum dot may further include a polyvalent metal compound or a moiety derived therefrom on the surface thereof. The polyvalent metal compound may include a compound including a divalent or polyvalent metal of Zn, In, Ga, Mg, Ca, Sc, Sn, Ti, V, Cr, Mn, Fe, Co, Ni, Cu, Sr, Y, Zr, Nb, Mo, Ba, Au, Hg, Tl, or a combination thereof. The polyvalent metal compound may be an organometallic compound, an organic salt, an inorganic salt, or a combination thereof. In an embodiment, the polyvalent metal compound may include a (meth)acrylate moiety, RCOO— (R is a C10 or more aliphatic hydrocarbon group), a halide, or a combination thereof.

In an embodiment, the polyvalent metal compound may include a metal organic salt, such as, a metal acetate, a metal propinonate, a metal butyrate, a metal(meth)acrylate, and the like, a metal halide, such as, a metal chloride, a metal bromide, a metal iodide, and the like, a hydrocarbyl metal, such as, an alkylated metal, an arylated metal, a hydrocarbyl metal halide, or a combination thereof. In an embodiment, the polyvalent metal compound may include a metal chloride, such as, zinc chloride, indium chloride, cadmium chloride, aluminum chloride, iron chloride, manganese chloride, and the like; an alkylated metal, such as, diethyl zinc, dipropyl zinc, dibutyl zinc, triethyl aluminum, tributyl aluminum, and the like; a metal carboxylate, for example, zinc acetate, zinc acrylate, indium acetate, or a combination thereof. In an embodiment, the polyvalent metal compound may include zinc acetate, zinc propinonate, zinc butyrate, zinc (meth)acrylate, zinc chloride, zinc bromide, zinc iodide, or a combination thereof.

An embodiment provides a method of producing the aforementioned quantum dot. The method includes, obtaining a first organic solution including a semiconductor nanocrystal having a surface on which a third ligand is bound;

adding a first thiol compound to the first organic solution to perform a first surface exchange reaction and to obtain a semiconductor nanocrystal wherein a first ligand (derived from the first thiol compound) is bound to at least a portion thereof (hereinafter, a semiconductor nanocrystal that is surface-modified with the first ligand); and preparing a second organic solution including the semiconductor nanocrystal that is surface-modified with the first ligand;

adding a polyvalent metal compound and a second thiol compound to the second organic solution to perform a second surface exchange reaction and to obtain a semiconductor nanocrystal wherein the first ligand and a second ligand (derived from the second thiol compound) are bound to the surface.

The third ligand may be a ligand bound to the surface of the quantum dot during the production process of the semiconductor nanocrystal by a chemical wet process. The third ligand, the semiconductor nanocrystal, the first thiol compound, the first ligand, the second thiol compound, and the second ligand are the same as described above.

The first surface exchange reaction and the second surface exchange reaction may be carried out under relatively mild conditions in terms of a temperature and a reaction time. Organic solvents included in the first organic solution and second organic solution may be halogenated (e.g., chlorinated) hydrocarbon, such as, chloroform or dichloroethane, C6 to C40 substituted or unsubstituted aromatic hydrocarbon, such as, toluene or xylene, C3 to C40 substituted or unsubstituted alicyclic hydrocarbon, such as cyclohexane or cyclohexylacetate, a C1 to C10 alcohol, such as, ethanol, or a combination thereof, but are not limited thereto.

The conditions of the surface exchange reaction are not particularly limited and may be selected appropriately depending on the semiconductor nanocrystal, the third ligand, the first and second thiol compounds, and the polyvalent metal compound. In an embodiment, the temperature of the surface exchange may be less than or equal to about 90° C., less than or equal to about 80° C., less than or equal to about 70° C., or even less than or equal to about 65° C. In an embodiment, the temperature of the surface exchange may be greater than or equal to room temperature, for example, greater than or equal to about 20° C., greater than or equal to about 30° C., greater than or equal to about 40° C., or greater than or equal to about 50° C. For example, the temperature of the surface exchange may be from about 40° C. to about 70° C. The surface exchange may be carried out for greater than or equal to about 10 minutes, for example, greater than or equal to about 20 minutes, greater than or equal to about 30 minutes, greater than or equal to about 40 minutes, or greater than or equal to about 50 minutes.

The concentration of the semiconductor nanocrystal in the organic solvent may be selected appropriately and is not particularly limited. For example, an amount of the semiconductor nanocrystal may be greater than or equal to about 0.01 grams (g), for example greater than or equal to about 0.1 g, per 1 milliliter (mL) of the organic solvent. The amount of the semiconductor nanocrystal may be less than or equal to about 1 g, for example, less than or equal to about 0.5 g, per 1 mL of the organic solvent.

An amount of the polyvalent metal compound for the second surface exchange reaction may be greater than or equal to about 5 mol eq., (i.e., 5 molecules of the compound per one quantum dot), for example, greater than or equal to about 10 mol eq., greater than or equal to about 15 mol eq., greater than or equal to about 20 mol eq., greater than or equal to about 30 mol eq., greater than or equal to about 40 mol eq., greater than or equal to about 50 mol eq., greater than or equal to about 60 mol eq., greater than or equal to about 70 mol eq., greater than or equal to about 80 mol eq., greater than or equal to about 90 mol eq., or greater than or equal to about 100 mol eq., relative to the amount of the semiconductor nanocrystal, but is not limited thereto. The amount of the polyvalent metal compound may be less than or equal to about 1,500 mol eq., for example, 1,000 mol eq., less than or equal to about 900 mol eq., less than or equal to about 800 mol eq., less than or equal to about 700 mol eq., less than or equal to about 600 mol eq., less than or equal to about 500 mol eq., less than or equal to about 400 mol eq., less than or equal to about 300 mol eq., or less than or equal to about 250 mol eq., relative to the amount of the semiconductor nanocrystal, but is not limited thereto.

While not wishing to be bound by any theory, it is believed that by using the polyvalent metal compound, at least a portion, e.g., a significant amount, of the remaining third ligand after the first surface substitution reaction may be exchanged with the second thiol compound. Surface exchange with a thiol compound having a C8 or less alkyl group tends to cause precipitation of the quantum dot during the reaction. However, according to the method of an embodiment, it is possible to exchange a surface with a thiol compound having a C8 (e.g., C6 or C4) or less alkyl group, while maintaining dispersion without precipitation of the quantum dots. While not wishing to be bound by any theory, it is believed that during the second surface substitution reaction, a presence of the first ligand present on the surface of the semiconductor nanocrystal may contribute to the progress of the surface exchange reaction with the second ligand without precipitation of the quantum dots.

Amounts of the first thiol compound and the second thiol compound used in the surface exchange reaction may independently be greater than or equal to about 20 mol eq., for example, greater than or equal to about 40 mol eq., greater than or equal to about 50 mol eq., greater than or equal to about 60 mol eq., greater than or equal to about 70 mol eq., greater than or equal to about 80 mol eq., greater than or equal to about 90 mol eq., or greater than or equal to about 100 mol eq., relative to the amount of the quantum dot, but are not limited thereto. Amounts of the first thiol compound and the second thiol compound may independently be less than or equal to about 6,000 mol eq., for example, less than or equal to about 5,000 mol eq., less than or equal to about 4,000 mol eq., less than or equal to about 3,000 mol eq., less than or equal to about 2,000 mol eq., less than or equal to about 1,000 mol eq., less than or equal to about 900 mol eq., less than or equal to about 800 mol eq., less than or equal to about 700 mol eq., less than or equal to about 600 mol eq., less than or equal to about 500 mol eq., or less than or equal to about 400 mol eq., relative to the amount of the quantum dot, but are not limited thereto.

In the second surface exchange reaction, an amount of the thiol compound per 1 mole of the polyvalent metal compound may be greater than or equal to about 0.1 moles, for example, greater than or equal to about 0.5 moles, greater than or equal to about 1 mole, greater than about 1 mole, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In an embodiment, an amount of the thiol compound with respect to the polyvalent metal compound may be less than or equal to about 300 mol eq., less than or equal to about 200 mol eq., less than or equal to about 100 mol eq., less than or equal to about 90 mol eq., less than or equal to about 80 mol eq., or less than or equal to about 70 mol eq., per 1 mole of the polyvalent metal compound, but is not limited thereto.

The quantum dot may exhibit improved hole transport capability and improved quantum efficiency, such that when the quantum dot is included in an emission layer of a light emitting device (for example, an electroluminescent device), a balance of electron-holes and hole transport capability may be improved to enhance luminous efficiency of the light emitting device. In the electronic device including the quantum dot, since a device resistance is reduced and a turn-on voltage is reduced, power efficiency of the device may be improved.

An embodiment provides a light emitting device. In the light emitting device, the emission layer including the aforementioned quantum dot, for example, a plurality of the aforementioned quantum dots, is arranged in an anode and a cathode facing each other.

Figure 3:
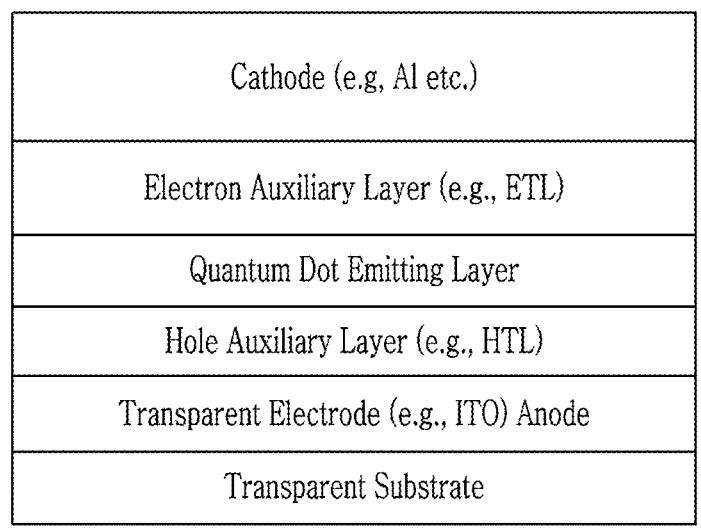
FIG. 3 is a cross-sectional view of a light emitting device according to an embodiment.

In an embodiment, an anode disposed on a transparent substrate may include a metal oxide transparent electrode (e.g., ITO), and a cathode may include a metal (Mg, Al, etc.) having a predetermined (e.g., relatively low) work function. For example, poly(9,9-dioctyl-fluorene-co-N-(4-butylphenyl)-diphenylamine) (TFB), polyarylamine, poly(N-vinylcarbazole) (PVK), or a combination thereof may be disposed as a hole transport layer between the transparent electrode and the emission layer, poly(3,4-ethylenedioxythiophene): poly(styrenesulfonate) (PEDOT:PSS), p-type metal oxide, or a combination thereof may be disposed as a hole injecting layer between the transparent electrode and the emission layer, or a combination thereof. An electron auxiliary layer (for example, an electron transport layer, etc.) may be disposed between the quantum dot emission layer and the cathode (see FIG. 3)

Figure 4:
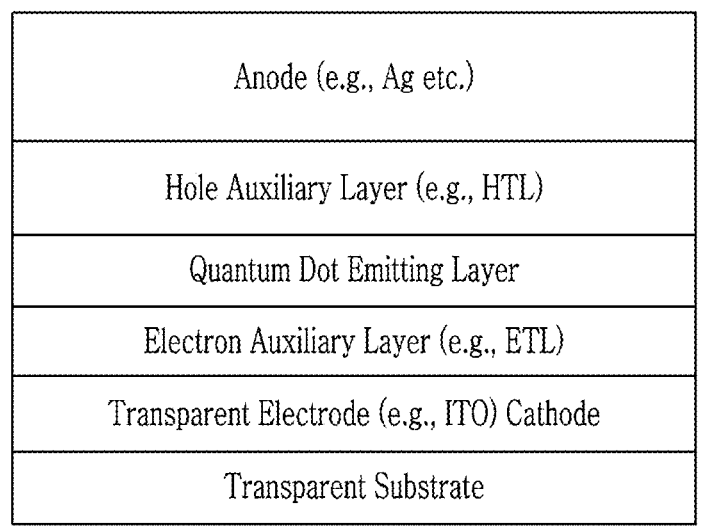
FIG. 4 is a schematic cross-sectional view of a light emitting device according to an embodiment.

In an embodiment, a light emitting device may have an inverted structure. Herein, a cathode disposed on a transparent substrate may include a metal oxide-based transparent electrode (e.g., ITO, fluorine-doped tin oxide (FTO), etc.), and the anode may include a metal (e.g., Au, Ag, etc.) having a predetermined (e.g., a relatively high) work function. For example, an n-type metal oxide (ZnO) or the like may be disposed between the cathode and the emission layer as an electron auxiliary layer (for example, an electron transport layer). A hole auxiliary layer (for example, a hole transport layer including TFB PVK, or a combination thereof, a hole injecting layer including $MoO_3$ or another p-type metal oxide, or a combination thereof) may be disposed between the metal anode and the quantum dot emission layer. (see FIG. 4)

Figure 5:
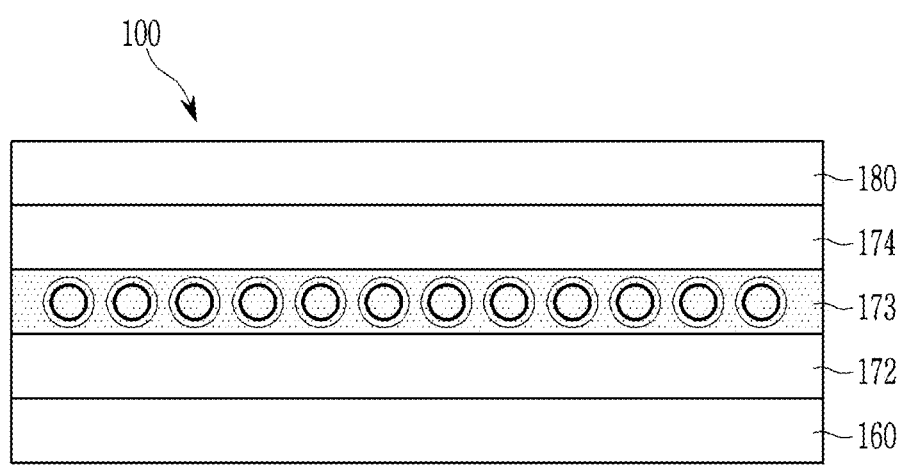
FIG. 5 is a schematic cross-sectional view of a light emitting device according to an embodiment.
Figure 6:
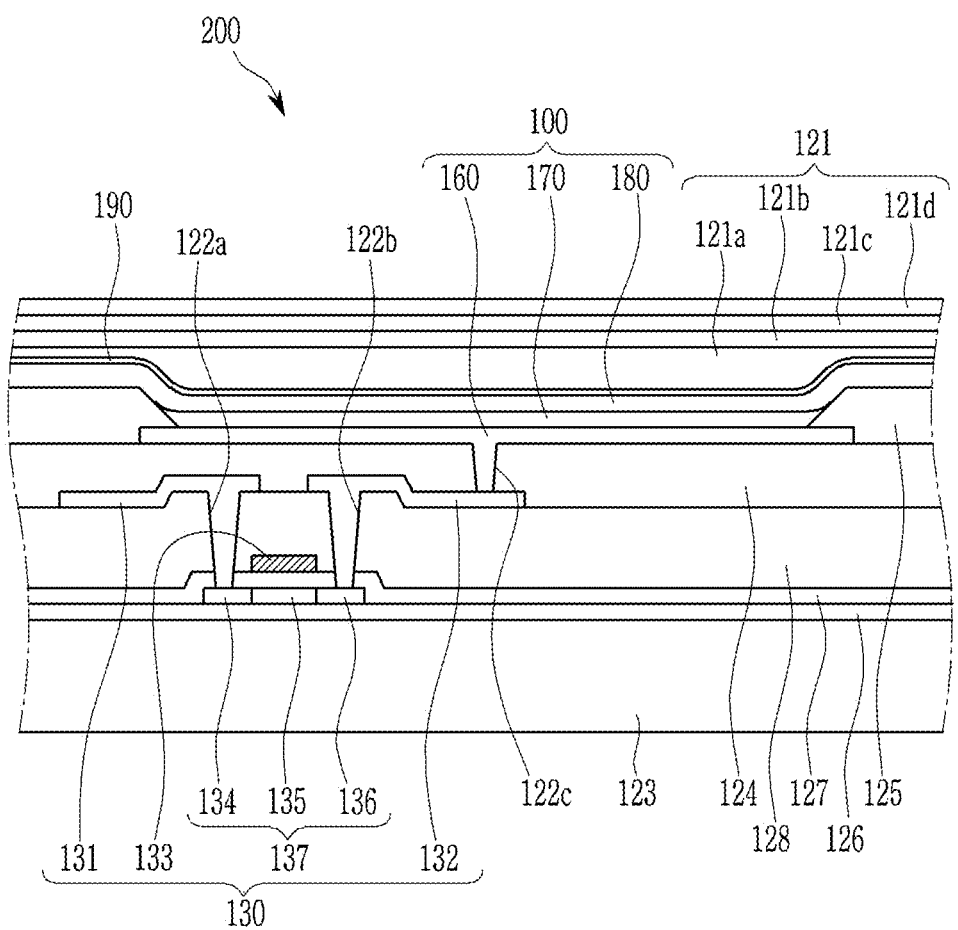
FIG. 6 is a cross-sectional view of a display device according to an embodiment.

Hereinafter, the light emitting device and the display device including the same will be described in detail with reference to FIGS. 5 and 6. FIG. 5 is a cross-sectional view of a light emitting device according to an embodiment and FIG. 6 is a cross-sectional view of a display device according to an embodiment. Although a structure of the display device 200 shown in FIG. 6 is described as a driving thin film transistor and a light emitting device, the structure of the display device may include a switching thin film transistor, a signal line, and the like.

Referring to FIG. 5, a light emitting device 100 according to an embodiment has a structure in which a first electrode 160, a hole auxiliary layer 172, an emission layer 173, an electron auxiliary (e.g., transport) layer 174, and a second electrode 180 are stacked in this order. The light emitting device layer 170 of FIG. 6 which will be described later includes a hole auxiliary layer 172, an emission layer 173, and an electron transport layer 174 of FIG. 5.

When the first electrode 160 is an anode, the first electrode 160 may include a material having a high work function such that holes may be injected relatively easily.

The first electrode 160 according to an embodiment may be a transparent electrode and may be formed to have a thin thickness using a conductive oxide, such as, indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal, such as calcium (Ca), ytterbium (Yb), aluminum (Al), silver (Ag), or magnesium (Mg), a conductive carbon, such as, graphene or carbon nanotube, or a conductive polymer, such as PEDOT:PSS.

In addition, the first electrode 160 is not limited thereto and may be formed in a stack structure of two or more layers.

The hole auxiliary layer 172 may be disposed between the first electrode 160 and the emission layer 173. Herein, the hole auxiliary layer 172 may be a hole injecting layer that facilitates injection of holes, a hole transport layer that facilitates transport of holes from the first electrode 160 to the emission layer 173, or a combination thereof.

In addition, the hole auxiliary layer 172 may include an electron blocking layer that blocks transport of electrons.

The hole transport layer, the hole injecting layer, or a combination thereof may include, for example, poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly(N-vinylcarbazole) (PVK), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), or a combination thereof, but are not limited thereto.

On the other hand, in FIG. 5, the hole auxiliary layer 172 is formed as a single layer. However, the present disclosure is not limited thereto and the hole auxiliary layer 172 may be formed of a plurality of layers including two or more layers.

An energy level arrangement between energy levels of the hole auxiliary layer and the emission layer including quantum dots may be inadequate (e.g., a gap therebetween is too large), and hole injection from the hole transport layer to the emission layer may not smoothly occur. However, when using the quantum dot according to an embodiment, it may be possible to inject holes from the hole transport layer to the emission layer relatively easily by controlling a difference in energy levels.

When the holes are injected smoothly, a balance between electrons and holes combined in the emission layer 173 may be improved, and stability and luminous efficiency of the light emitting device 100 may be improved.

Next, the emission layer 173 is disposed on the hole auxiliary layer 172. The emission layer 173 includes the quantum dot. For example, the emission layer 173 may display primary colors such as blue, green, or red, or combined colors thereof. The emission layer may be formed by applying dispersion in which a quantum dot is dispersed in a solvent by spin coating, inkjet or spray coating, and drying. The emission layer may be formed to have a thickness of greater than or equal to about 5 nm, for example about 10 nm to about 100 nm, about 10 nm to about 50 nm, or about 15 nm to about 30 nm.

An electron auxiliary layer 174 may be disposed on the emission layer 173. The electron auxiliary layer 174 may be disposed between the second electrode 180 and the emission layer 173. The electron auxiliary layer 174 may be an electron injection layer that facilitates injection of electrons from the second electrode 180 to the emission layer 173, an electron transport layer that facilitates transport of electrons, or a combination thereof.

The electron auxiliary layer 174 may also include a hole blocking layer that blocks transport of holes.

The electron transport layer, the electron injecting layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but are not limited thereto.

The hole blocking layer may include, for example, 1,4,5,8-naphthalene-tetracarboxylic dianhydride (NTCDA), bathocuproine (BCP), tris[3-(3-pyridyl)-mesityl]borane (3TPYMB), LiF, Alq3, Gaq3, Inq3, Znq2, Zn(BTZ)2, BeBq2, or a combination thereof, but is not limited thereto.

In FIG. 5, the electron auxiliary layer 174 is formed as a single layer. However, the present disclosure is not limited thereto and the electron auxiliary layer 174 may be formed of a plurality of layers including two or more layers.

A second electrode 180 is disposed on the electron auxiliary layer 174. In the light emitting device according to an embodiment, the first electrode 160 may be an anode and the second electrode 180 may be a cathode. However it is not limited thereto, the first electrode 160 may be a cathode and the second electrode 180 may be an anode.

The second electrode 180 may also be a transparent electrode, may be formed to have a thin thickness by using a conductive oxide, such as, indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal, such as, calcium (Ca), ytterbium (Yb), aluminum (Al), silver (Ag), or magnesium (Mg), a metal alloy, a conductive carbon, such as, graphene or carbon nanotube, or a conductive polymer, such as, PEDOT:PSS.

Hereinafter, a display device including the aforementioned light emitting device will be described referring to FIG. 6.

Referring to FIG. 6, a buffer layer 126 may be disposed on a substrate 123. The buffer layer 126 may help prevent penetration of impurities and may flatten the surface of the substrate 123.

The semiconductor layer 137 is disposed on the buffer layer 126. The semiconductor layer 137 is formed of a polysilicon film.

The semiconductor layer 137 includes a channel region 135 that is not doped with an impurity, and a source region 134 and a drain region 136 that are disposed on both sides of the channel region 135, wherein each of the source region 134 and drain region 136 may be doped. Here, the doped ion impurity may vary depending on a type of thin film transistor.

The gate insulating film 127 is disposed on the semiconductor layer 137, and a gate line including a gate electrode 133 is disposed on the gate insulating film 127. At this time, the gate electrode 133 overlaps with a part of the semiconductor layer 137, particularly, the channel region 135.

An interlayer insulating film 128 is disposed on the gate insulating film 127 and the gate electrode 133. The gate insulating film 127 and the interlayer insulating film 128 have a first contact hole 122a and a second contact hole 122b overlapping the source region 134 and the drain region 136 of the semiconductor layer 137.

A data line including the source electrode 131 and the drain electrode 132 is disposed on the interlayer insulating film 128.

The source electrode 131 and the drain electrode 132 are respectively connected to the source region 134 and the drain region 136 of the semiconductor layer 137 through the first contact hole 122a and the second contact hole 122b formed in the interlayer insulating film 128 and the gate insulating film 127.

The aforementioned semiconductor layer 137, the gate electrode 133, the source electrode 131, and the drain electrode 132 may be included in, e.g., constitute, the thin film transistor 130. The structure of the thin film transistor 130 is not limited to the aforementioned embodiment and may be variously changed into a configuration that may be carried out by a person skilled in the art.

Next, the planarization film 124 is disposed on the interlayer insulating film 128 and the data line. The planarization film 124 serves to remove a step in order to increase luminous efficiency of the light emitting device disposed thereon.

The planarization film 124 may have a third contact hole 122c overlapping with the drain electrode 132.

Herein, an embodiment is not limited to the aforementioned structure, and in an embodiment, one of the planarization film 124 and the interlayer insulating film 128 may be omitted as desired.

Next, the first electrode 160 included in the light emitting device 100 is disposed on the planarization film 124. The first electrode 160 may be a pixel electrode. The first electrode 160 is connected to the drain electrode 132 through the third contact hole 122c of the planarization film 124.

A pixel defining film 125 having an opening overlapping with the first electrode 160 is disposed on the planarization film 124. The light emitting device layer 170 may be disposed for each opening of the pixel defining film 125. That is, the pixel defining film 125 may define a pixel area where each light emitting device layer 170 is disposed.

The light emitting device layer 170 is disposed on the first electrode 160. The light emitting device layer 170 may include a hole auxiliary layer 172, an emission layer 173, and an electron auxiliary layer 174, as described with reference to FIG. 5, which are the same as the aforementioned constituent elements, and thus descriptions thereof will be omitted.

The second electrode 180 is disposed on the light emitting device layer 170. The second electrode 180 may be a common electrode. The first electrode 160, the light emitting device layer 170, and the second electrode 180 may be included in, e.g., constitute, the light emitting device 100.

The first electrode 160 and the second electrode 180 may be formed of a transparent conductive material or a semi-transmissive or reflective conductive material, respectively. Depending on materials forming the first electrode 160 and the second electrode 180, the display device may be a top emission type, a bottom emission type, or a both-sided emission type.

An overcoat 190 protecting the second electrode 180 is disposed on the second electrode 180.

Then, the thin film encapsulation layer 121 is disposed on the overcoat 190. The thin film encapsulation layer 121 protects the light emitting device 100 and the circuit portion disposed on the substrate 123 from the outside by sealing them.

The thin film encapsulation layer 121 includes organic encapsulation films 121a and 121c and inorganic encapsulation films 121b and 121d which are alternately stacked one by one. FIG. 6 illustrates a case where, for example, the two organic encapsulation films 121a and 121c and the two inorganic organic encapsulation films 121b and 121d are alternately stacked one by one to form the thin film encapsulation layer 121. However, the configuration of the thin film encapsulation layer 121 is not limited thereto, and may be altered in various manners as desired.

Hereinafter, specific examples of the present disclosure will be described. It should be noted, however, that these examples described below are only intended to illustrate or explain the present disclosure in detail, and the scope of the invention should not be limited thereby.

Analysis Method

1. Photoluminescence Analysis

Photoluminescence (PL) spectra of the produced quantum dots are obtained using a Hitachi F-7000 spectrometer at an irradiation wavelength of 458 nm (in the case of a red quantum dot (QD), 532 nanometers (nm)).

2. Quantum Efficiency (Quantum Yield) of Quantum Dot

Quantum efficiency is obtained by dividing the number of photons emitted with photoluminescence from a sample by the number of photons absorbed by the sample. The quantum efficiency (or external quantum efficiency (EQE)) is measured with respect to the quantum dot dispersion by using HAMAMATSU-Quantaurus-QY, C11347 (Hamamatsu Corp.).

3. Thermogravimetric Analysis

The thermogravimetric analysis of the quantum dots is performed by using a thermogravimetric analyzer (TA Q5000 (Q5000IR) manufactured by TA Instruments).

4. Electroluminescence Analysis

Electroluminescence analysis is performed by using a current-voltage (IV) tester 2635B manufactured by Keithley Co., Ltd. and CS-2000A of Konica Minolta Co., Ltd.

Production of Quantum Dots

Reference Example 1: Production of Blue Light Emitting Quantum Dot (BQD)

1. Production of ZnTeSe Core

Selenium and tellurium are dispersed in trioctylphosphine (TOP) to obtain a 2 molar (M) Se(Te)/TOP stock solution. On the other hand, a trioctylamine solution including 0.125 millimoles (mmol) of zinc acetate and 0.25 mmol of palmitic acid is prepared in a 400 milliliter (mL) reaction flask. The solution is heated at 120° C. under vacuum. After 1 hour, the atmosphere of the reactor is converted into nitrogen.

After heating the solution up to 300° C., the prepared Se(Te)/TOP stock solution is rapidly added thereto, and the obtained mixture is reacted for 1 hour. When a reaction is complete, the reaction solution is cooled down to room temperature, acetone is added thereto, and a precipitate therein is centrifuged and then, dispersed in toluene.

2. Production of Blue Light Emitting ZnTeSe/ZnSeS Core/Shell Quantum Dot 0.9 mmol of zinc acetate, 1.8 mmol of oleic acid, and 10 mL of trioctylamine are put in a reactor, and treated under vacuum at 120° C., for 10 minutes. The reaction flask is internally substituted with nitrogen, and heated up to 280° C. Subsequently, the prepared toluene dispersion of a Zn(Te)Se core (OD=optical density of $1^{st}$ excitonic absorption, OD=0.45) is added thereto within 10 seconds, and reacted with 0.6 mmol of Se/TOP and 2.0 mmol of S/TOP for 120 minutes to prepare a (crude) reaction solution. When a reaction is complete, the reaction solution is rapidly cooled down to room temperature (24° C.), ethanol is added thereto to precipitate a quantum dot, and the precipitated quantum dot is centrifuged and redispersed in cyclohexane to prepare a ZnTeSe/ZnSeS quantum dot, which is a blue light emitting quantum dot (BQD). The quantum dot (BQD) has a PL light emitting center peak of about 450 nm, and PL QY of 60%.

Quantum Dot Surface Exchange

Reference Example 2: DDT Substitution 2 grams (g) of dodecane thiol (DDT) is added to 100 g of the BQD dispersion according to Reference Example 1 to obtain a reaction solution. The reaction solution is stirred at 60° C. to 80° C., for 30 minutes.

After the stirring, ethanol is added to the reaction solution to precipitate a quantum dot, of which the surface is exchanged with dodecane thiol (hereinafter, SQD). The obtained SQD is dispersed in chloroform to obtain a transparent dispersion.

Preparation Example 1

0.23 g of zinc chloride and 2 g (2.4 ml) of octane thiol (OT) are added to 100 g of the SQD dispersion according to Reference Example 2 to obtain a reaction solution. The reaction solution is stirred at 60° C. to 80° C., for 30 minutes.

After stirring the reaction solution, ethanol is added thereto to precipitate a quantum dot, and the precipitated quantum dot is centrifuged to obtain a quantum dot surface-exchanged with dodecane thiol and octane thiol (hereinafter, SQD-ZnOT). The SQD-ZnOT is dispersed in chloroform to obtain transparent dispersion.

Preparation Example 2

The same method as that of Preparation Example 1 is performed, except that 1.6 g (1.9 ml) of hexane thiol is used instead of the octane thiol (OT). As a result, a quantum dot surface-exchanged with dodecane thiol and hexane thiol (hereinafter, SQD-ZnHT) is obtained. The obtained SQD-ZnHT is dispersed in chloroform to obtain transparent dispersion.

Preparation Example 3

The same method as that of Preparation Example 1 is performed, except that 1.2 g (1.4 ml) of butane thiol is used instead of the octane thiol (OT). As a result, a quantum dot surface-exchanged with dodecane thiol and butane thiol (hereinafter, SQD-ZnBT) is obtained. The obtained SQD-ZnHT is dispersed in chloroform to obtain transparent dispersion.

Preparation Comparative Example 1

The same method as that of Preparation Example 1 is performed, except that 2.7 g (3.2 ml) of dodecane thiol is used instead of the octane thiol (OT). As a result, a quantum dot surface-exchanged with dodecane thiol on the entire surface (hereinafter, SQD-ZnDDT) is obtained. The obtained SQD-ZnDDT is dispersed in chloroform to obtain transparent dispersion.

Preparation Comparative Example 2

A reaction solution is obtained by adding 2 g of octane thiol (OT) to 100 g of the BQD dispersion of Reference Example 1. The obtained reaction solution is stirred at 60° C. to 80° C. for 30 minutes.

After stirring the reaction solution, ethanol is added thereto to precipitate a quantum dot, and the precipitated quantum dot is centrifuged to obtain a quantum dot surface-exchanged with octane thiol (hereinafter, OT-QD). The obtained OT-QD is dispersed in chloroform to obtain transparent.

Preparation Comparative Example 3

A reaction is performed in the same method as Preparation Comparative Example 2, except that 1.6 g of hexane thiol is used instead of octane thiol (OT) to prepare a reaction solution. As a result, a quantum dot surface-exchanged with hexane thiol (hereinafter, HT-QD) is obtained. The obtained HT-QD is dispersed in chloroform to obtain transparent dispersion.

Preparation Comparative Example 4

A reaction is performed in the same method as Preparation Comparative Example 2, except that 1.2 g of butane thiol is used instead of octane thiol (OT) to prepare a reaction solution. As a result, a quantum dot surface-exchanged with butane thiol (hereinafter, BT-QD) is obtained. The obtained BT-QD is dispersed in chloroform to obtain transparent dispersion.

Preparation Comparative Example 5

A reaction solution is obtained by adding 0.23 g of zinc chloride and 1.6 g of hexane thiol (HT) to 100 g of the BQD dispersion according to Reference Example 1. The obtained reaction solution is stirred at 60° C., for 30 minutes.

After the stirring, ethanol is added to precipitate a quantum dot, and the precipitated quantum dot is centrifuged to obtain a quantum dot, of which the surface is exchanged with hexane thiol. The surface-exchanged quantum dot is not dispersed, but precipitated in chloroform.

Experimental Example 1: Thermogravimetric Analysis I

Figure 7:
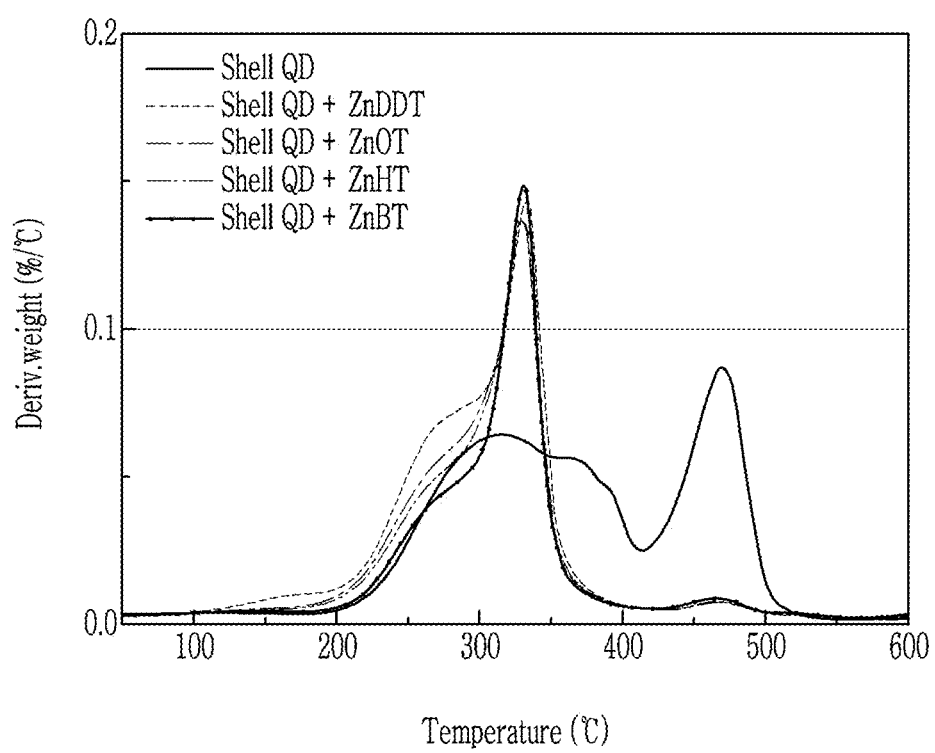
FIG. 7 is a graph of derivative weight loss (Deriv·weight) (percent per ° C. (%/° C.))) versus Temperature (° C.) of Experimental Example 1 (thermogravimetric analysis).

Each thermogravimetric analysis of the quantum dots according to Reference Example 2, Preparation Examples 1 to 3, and Preparation Comparative Example 1 is performed, and the results are shown in Table 1 and FIG. 7 (a derivative weight loss graph).

TABLE 1

| | | QD (g) | OA ligand (g) | OA ligand mole percent of total ligands (%) | First ligand derived from DDT (g) | First ligand derived from DDT mole percent of total ligands (%) | Second ligand (g) | Second ligand mole percent of total ligands (%) | Total ligand mmol/ QD(g) |
|---|---|---|---|---|---|---|---|---|---|
| Reference Example 1 | BQD | 81.8 | 17.6 | 100.0 | 0 | 0.0 | | | 0.76 |
| Reference Example 2 | SQD | 85.6 | 4.75 | 26.2 | 9.61 | 73.8 | 0 | 0.0 | 0.75 |
| Preparation Comparative Example 1 | SQD-ZnDDT | 87.6 | 0.7 | 4.1 | 6.83 | 56.4 | 4.78 | 39.5 | 0.68 |
| Preparation Example 1 | SQD-ZnOT | 88.8 | 0.66 | 3.8 | 6.92 | 55.9 | 3.6 | 40.3 | 0.69 |
| Preparation Example 2 | SQD-ZnHT | 89.4 | 0.69 | 4.0 | 6.88 | 55.0 | 3 | 41.1 | 0.69 |
| Preparation Example 3 | SQD-ZnBT | 90 | 0.86 | 4.6 | 6.18 | 46.1 | 2.95 | 49.3 | 0.74 |

Referring to the results of Table 1, each quantum dot of Preparation Examples 1 to 3 includes less than or equal to 15 wt % of an organic substance based on a total weight of the quantum dot. The results of Table 1 and FIG. 7 show that when a quantum dot is surface-substituted without using zinc chloride, an oleic acid (OA) ligand, e.g., a considerable amount of an oleic acid ligand, remains on the surface of the quantum dot. However, the quantum dots according to Preparation Examples 1 to 3 show that an amount of the oleic acid ligand is reduced.

Experimental Example 2: Thermogravimetric Analysis II

Figure 8:
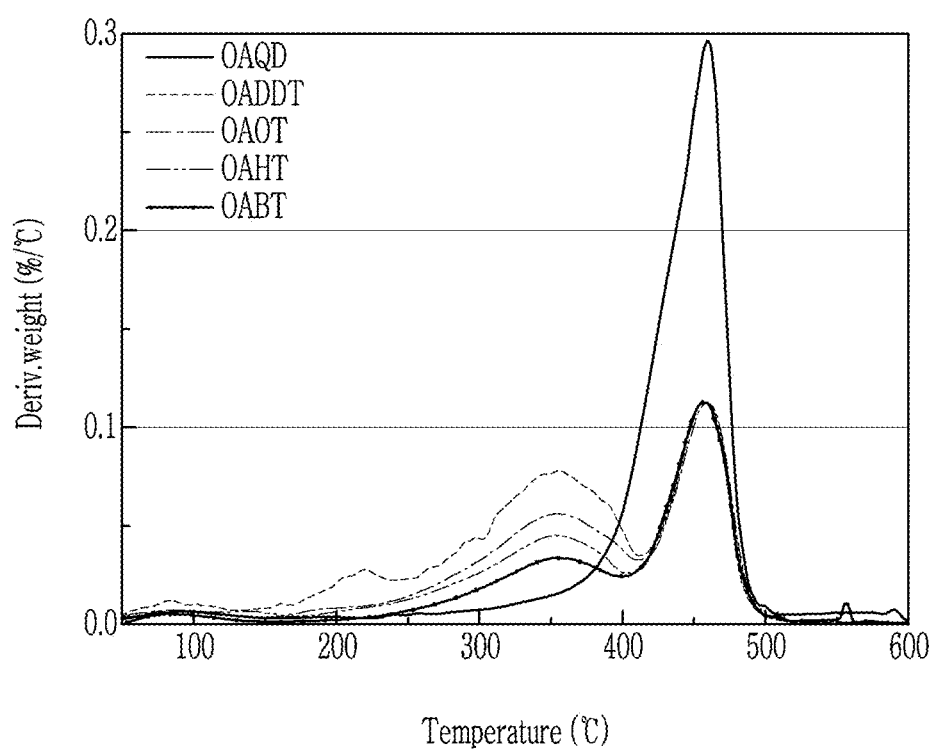
FIG. 8 is a graph of derivative weight loss (Deriv·weight) (%/° C.)) versus Temperature (° C.) of Experimental Example 2 (thermogravimetric analysis).

A thermogravimetric analysis of the quantum dots of Reference Example 2 and Preparation Comparative Examples 2 to 4 is performed, and the results are shown in Table 2 and FIG. 8 (a derivative weight loss graph).

TABLE 2

| | | QD (g) | OA ligand (g) | OA ligand Mole percent of total ligands (%) | Thiol ligand (g) | Thiol ligand Mole percent of total ligands (%) | Total ligand mmol/ QD(g) |
|---|---|---|---|---|---|---|---|
| Preparation Comparative Example 2 | OT-QD | 86.8 | 5.54 | 28.7 | 7.14 | 71.3 | 0.79 |
| Preparation Comparative Example 3 | HT-QD | 88.2 | 5.69 | 30.9 | 5.32 | 69.1 | 0.74 |
| Preparation Comparative Example 4 | BT-QD | 90.1 | 5.79 | 33.7 | 3.64 | 66.3 | 0.68 |

Referring to the results of Table 2 and FIG. 8, when a quantum dot is surface-substituted without using zinc chloride, an oleic acid ligand, e.g., a considerable amount of an oleic acid ligand, remains on the surface of the quantum dot. While not wishing to be bound by any theory, it is believed that the quantum dot may be formed into transparent dispersion with respect to an organic solvent due to such an oleic acid ligand even during substitution of the short ligand.

Manufacture of Electroluminescent Device

Comparative Example 1

A light emitting device is manufactured by using the quantum dot (SQD) of Reference Example 2. Indium tin oxide (ITO) (an anode) is deposited on a substrate, and a poly(3,4-ethylenedioxythiophene):poly(styrenesulfonate) (PEDOT:PSS) layer and a poly(9,9-dioctyl-fluorene-co-N-(4-butylphenyl)-diphenylamine) (TFB) layer (or a polyarylamine, poly(N-vinylcarbazole) (PVK) layer) as a hole injecting layer (HIL) and a hole transport layer (HTL), respectively, are formed thereon in a wet coating method. Then, an emission layer is formed thereon to be 15 nm thick by spin coating the quantum dot solution according to Reference Example 2.

On the emission layer, an ET204: lithium quinolate ((8-(4-(4,6-di(naphthalen-2-yl)-1,3,5-triazin-2-yl)phenyl)quinolone):Liq) layer and a Liq layer are deposited as an electron transport layer (ETL). On the electron transport layer (ETL), an Al electrode (a cathode) is deposited.

Comparative Example 2

A light emitting device is manufactured according to the same method as Comparative Example 1, except that the quantum dot (SQD-ZnDDT) of Preparation Comparative Example 1 is used instead of the quantum dot (SQD) of Reference Example 2.

Example 1

A light emitting device is manufactured according to the same method as Comparative Example 1, except that the quantum dot (SQD-ZnOT) of Preparation Example 1 is used instead of the quantum dot (SQD) of Reference Example 2.

Example 2

A light emitting device is manufactured according to the same method as Comparative Example 1, except that the quantum dot (SQD-ZnHT) of Preparation Example 2 is used instead of the quantum dot (SQD) of Reference Example 2.

Example 3

A light emitting device is manufactured according to the same method as Comparative Example 1, except that the quantum dot (SQD-ZnBT) of Preparation Example 3 is used instead of the quantum dot (SQD) of Reference Example 2.

Comparative Example 3: OT Only/TFB

A light emitting device is manufactured according to the same method as Comparative Example 1, except that the quantum dot (OT-QD) of Preparation Comparative Example 2 is used instead of the quantum dot (SQD) of Reference Example 2.

Comparative Example 4: HT Only/TFB

A light emitting device is manufactured according to the same method as Comparative Example 1, except that the quantum dot (HT-QD) of Preparation Comparative Example 3 is used instead of the quantum dot (SQD) of Reference Example 2.

Comparative Example 5: BT Only/TFB

A light emitting device is manufactured according to the same method as Comparative Example 1, except that the quantum dot (BT-QD) of Preparation Comparative Example 4 is used instead of the quantum dot (SQD) of Reference Example 2.

Experimental Example 3: Measurement of Electroluminescence Properties

Photoluminescence properties (current efficiency and current-voltage characteristics) of the light emitting devices according to Examples 1 to 3 and Comparative Examples 1 to 5 are measured, while a voltage (0 to 7 V) is applied thereto. The results are shown in Table 3.

TABLE 3

| | Description | Max. EQE (%) | EQE at 100 nit* | Max. candelas per ampere (Cd/A) | Max. Wavelength (Lambda) (nm) | Full Width at Half Maximum (FWHM) (nm) |
|---|---|---|---|---|---|---|
| Comparative Example 2 | Shell + DDT/PVK | 9.570 | 9.455 | 6.190 | 455 | 25 |
| Example 1 | Shell + OT/PVK | 11.488 | 10.988 | 7.043 | 454 | 24 |
| Example 2 | Shell + HT/PVK | 11.486 | 10.988 | 7.076 | 454 | 24 |
| Example 3 | Shell + BT/PVK | 11.543 | 11.210 | 7.268 | 454 | 24 |
| Comparative Example 1 | DDT only/TFB | 3.533 | 3.383 | 2.634 | 454 | 24 |
| Comparative Example 3 | OT only/TFB | 3.694 | 3.557 | 2.703 | 454 | 24 |
| Comparative Example 4 | HT only/TFB | 4.731 | 4.308 | 2.908 | 455 | 24 |
| Comparative Example 5 | BT only/TFB | 5.728 | 5.183 | 3.600 | 454 | 24 |

*100 nit = 100 candelas per square meter

Referring to the results of Table 3, the devices of Examples show improved electroluminescence properties compared with the devices of Comparative Examples.

Experimental Example 4: Manufacture of Hole Only Device (HOD) and Evaluation of Hole Transport Properties 1. HOD (ITO/PEDOT:PSS/QD emission layer/PEDOT:PSS/Ag) is manufactured in the following method. An ITO patterned substrate is surface-treated with ultraviolet (UV)-ozone (UVO). A PEDOT:PSS layer is spin-coated to be 40 nm thick and heat-treated to remove an organic substance remaining therein. Each quantum dot dispersion according to Preparation Example 1 and Preparation Comparative Example 1 are spin-coated to form a 35 to 40 nm-thick emission layer, and heat-treated to remove an organic substance remaining therein. Subsequently, a PEDOT:PSS layer is spin-coated to be 40 nm thick as a hole transport layer (HTL), and heat-treated to remove an organic substance remaining therein. Then, silver (Ag) is thermally deposited under a mask to form an electrode. A sealing resin/glass is used to seal a device.

2. Current density of the manufactured HODs is measured, while a voltage of 0 to 6 volts (V) is applied thereto, and the results are shown in FIG. 9.

Figure 9:
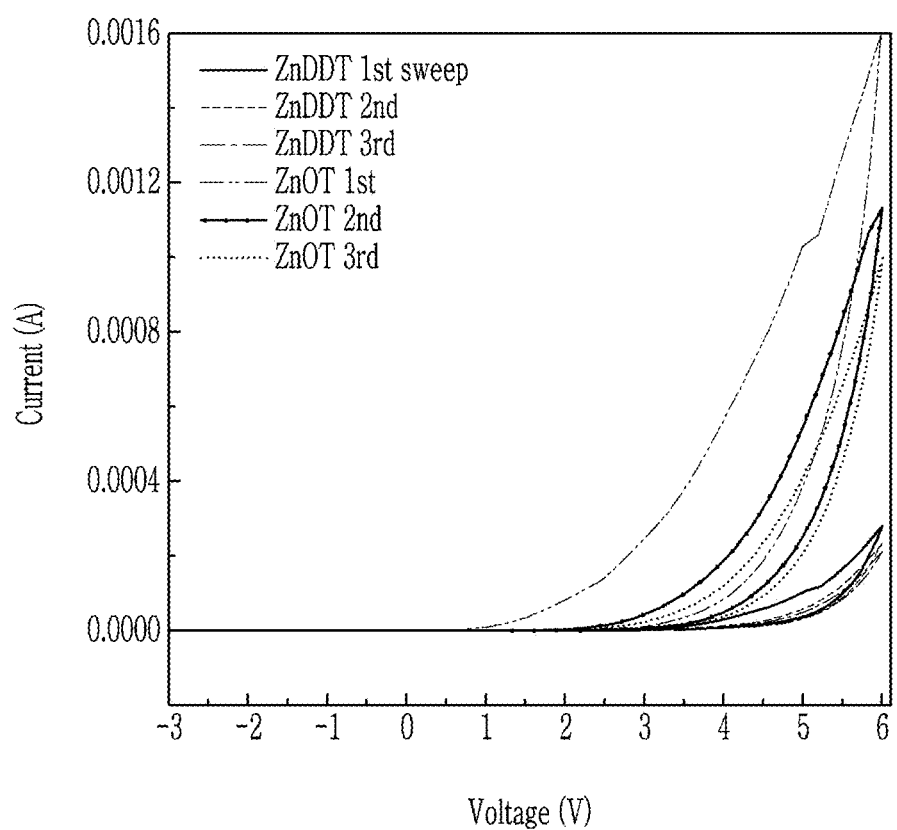
FIG. 9 is a graph of current (amperes (A)) versus voltage (volts (V)) showing the results of hole transport physical property evaluation in Experimental Example 4.

Referring to the results of FIG. 9, the light emitting device including the quantum dot of Preparation Example 1 (ZnOT $1^{st}$) shows increased hole transport characteristics compared with the light emitting device including the quantum dot according to Preparation Comparative Example 1 (ZnDDT $1^{st}$)

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
   a semiconductor nanocrystal, and
   an organic ligand bound to a surface of the semiconductor nanocrystal,
   wherein the organic ligand comprises
      a first ligand derived from a first thiol compound comprising a C12 or more aliphatic hydrocarbon group, and
      a second ligand derived from a second thiol compound comprising a C8 or less aliphatic hydrocarbon group.

2. The quantum dot of claim 1, wherein the quantum dot comprises
   a core comprising a first semiconductor nanocrystal, and
   a shell disposed on the core, the shell comprising a second semiconductor nanocrystal comprising a different composition from a composition of the first semiconductor nanocrystal.

3. The quantum dot of claim 2, wherein the first semiconductor nanocrystal and the second semiconductor nanocrystal are independently a Group II-VI compound, a Group III-V compound, a Group IV-VI compound, a Group IV element or compound, a Group compound, a Group I-II-IV-VI compound, or a combination thereof.

4. The quantum dot of claim 1, wherein the first thiol compound comprises a compound represented by Chemical Formula 1:

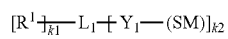

Chemical Formula 1

$[R^1 \frac{}{k1} - L_1 + Y_1 - (SM)]_{k2}$ wherein, $R^1$ is hydrogen; a substituted or unsubstituted C1 to C30 linear or branched alkyl group; a substituted or unsubstituted C2 to C30 linear or branched alkenyl group; a substituted or unsubstituted C2 to C30 linear or branched alkynyl group; a substituted or unsubstituted C6 to C30 aryl group; a substituted or unsubstituted C7 to C30 arylalkyl group; a substituted or unsubstituted C3 to C30 cycloalkyl group; a C1 to C30 alkoxy group; a hydroxy group; —$NH_2$; a substituted or unsubstituted C1 to C30 amine group (—NRR', wherein R and R' are independently hydrogen or a C1 to C30 linear or branched alkyl group, provided that R and R' are not simultaneously hydrogen); an isocyanate group; a halogen; —ROR', wherein R is a substituted or unsubstituted C1 to C20 alkylene group, and R' is hydrogen or a C1 to C20 linear or branched alkyl group; an acyl halide (—RC(=O)X, wherein R is a substituted or unsubstituted C1 to C30 alkylene group and X is a halogen); —C(=O)OR', wherein R' is hydrogen or a C1 to C30 linear or branched alkyl group; —CN; —C(=O)ONRR', wherein R and R' are independently hydrogen or a C1 to C20 linear or branched alkyl group; or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a substituted or unsubstituted C1 to C30 alkylene group or a substituted or unsubstituted C2 to C30 alkenylene group wherein a methylene moiety is replaced by a sulfonyl moiety, a carbonyl moiety, an ether moiety, a sulfide moiety, a sulfoxide moiety, an ester moiety, an amide moiety comprising hydrogen or a C1 to C10 alkyl group, or a combination thereof, $Y_1$ is a single bond; —C(=S)—; a substituted or unsubstituted C1 to C30 alkylene group; a substituted or unsubstituted C2 to C30 alkenylene group; or a C1 to C30 alkylene group or a C2 to C30 alkenylene group wherein a methylene moiety is replaced by a sulfonyl moiety, a carbonyl moiety, an ether moiety, a sulfide moiety, a sulfoxide moiety, an ester moiety, an amide moiety comprising hydrogen or a C1 to C10 linear or branched alkyl group, an imine moiety comprising hydrogen or a C1 to C10 linear or branched alkyl group, or a combination thereof;

M is hydrogen or a monovalent metal, k1 is 0 or an integer of 1 or greater, k2 is 1 or 2, provided that when k2 is 2, $Y_1$ is a single bond, and each SM moiety is bonded to an adjacent carbon atom in the $L_1$ moiety, a sum of k1 and k2 does not exceed the valence of $L_1$, and $R^1$, $L_1$, and $Y_1$ are selected such that the first thiol compound comprises a C12 or more aliphatic hydrocarbon group.

5. The quantum dot of claim 1, wherein the first thiol compound comprises a C12 to C40 substituted or unsubstituted alkyl group, a C12 to C40 substituted or unsubstituted alkenyl group, a poly(ethyleneglycol)alkylether thiol, or a combination thereof.

6. The quantum dot of claim 1, wherein the first thiol compound comprises dodecane thiol, tetradecane thiol, hexadecane thiol, octadecane thiol, oleyl mercaptan, or a combination thereof.

7. The quantum dot of claim 1, wherein the second thiol compound comprises a compound represented by Chemical Formula 2:

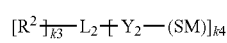

Chemical Formula 2

$[R^2 \frac{}{k3} - L_2 + Y_2 - (SM)]_{k4}$ wherein, $R^2$ is hydrogen; a substituted or unsubstituted C1 to C8 linear or branched alkyl group; a substituted or unsubstituted C2 to C8 linear or branched alkenyl group; a substituted or unsubstituted C6 aryl group; a substituted or unsubstituted C3 to C8 cycloalkyl group; a C1 to C8 alkoxy group; a hydroxy group; —$NH_2$; a substituted or unsubstituted C1 to C8 amine group (—NRR', wherein R and R' are independently hydrogen or a C1 to C4 linear or branched alkyl group provided that R and R' are not simultaneously hydrogen); an isocyanate group; a halogen; —ROR', wherein R is a substituted or unsubstituted C1 to C7 alkylene group, and R' is hydrogen or a C1 to C7 linear or branched alkyl group; an acyl halide (—RC(=O)X, wherein R is a substituted or unsubstituted C1 to C7 alkylene group and X is a halogen); —C(=O)OR', wherein R' is hydrogen or a C1 to C7 linear or branched alkyl group; —CN; —C(=O)ONRR', wherein R and R' are independently hydrogen or a C1 to C7 linear or branched alkyl group; or a combination thereof, $L_2$ is a carbon atom, a nitrogen atom, a substituted or unsubstituted C1 to C8 alkylene group, a substituted or unsubstituted C3 to C8 cycloalkylene group, a substituted or unsubstituted phenylene group, or a substituted or unsubstituted C1 to C8 alkylene group wherein a methylene moiety is replaced by a sulfonyl moiety, a carbonyl moiety, an ether moiety, a sulfide moiety, a sulfoxide moiety, an ester moiety, an amide moiety comprising hydrogen or a C1 to C10 alkyl group, $Y_2$ is a single bond; —C(=S)—; a substituted or unsubstituted C1 to C7 alkylene group; a substituted or unsubstituted C2 to C7 alkenylene group; or a C1 to C7 alkylene group or a C2 to C7 alkenylene group wherein a methylene moiety is replaced by a sulfonyl moiety, a carbonyl moiety, an ether moiety, a sulfide moiety, a sulfoxide moiety, an ester moiety, an amide moiety comprising hydrogen or a C1 to C7 linear or branched alkyl group, an imine moiety comprising hydrogen or a C1 to C7 linear or branched alkyl group, or a combination thereof;

M is hydrogen or a monovalent metal, k3 is 0 or an integer of 1 or greater, k4 is 1 or 2, provided that when k4 is 2, $Y_2$ is a single bond and each SM moiety is bonded to an adjacent carbon atom in the $L_1$ moiety, a sum of k3 and k4 does not exceed the valence of $L_2$, and $R^2$, $L_2$, and $Y_2$ are independently selected such that the second thiol compound comprises a C8 or less aliphatic hydrocarbon group.

8. The quantum dot of claim 1, wherein the second thiol compound comprises a C3 to C8 substituted or unsubstituted alkyl group, a C3 to C8 substituted or unsubstituted alkenyl group, or a combination thereof.

9. The quantum dot of claim 1, wherein the second thiol compound comprises a butane thiol, a pentane thiol, a hexane thiol, a heptane thiol, an octane thiol, 2-(2-methoxyethoxy)ethane thiol, 3-methoxybutyl 3-mercaptopropinonate, 3-methoxybutylmercaptoacetate, thioglycolic acid, 3-mercaptopropionic acid, thiopronine, 2-mercaptopropionic acid, 2-mercaptopropinonate, 2-mercaptoethanol, 1-thioglycerol, mercaptosuccinic acid, L-cysteine, 2-(dimethylamino)ethanethiol, 5-mercaptomethyltetrazole, 2,3-dimercapto-1-propanol, glutathione, diethyldithiocarbamate, or a combination thereof.

10. The quantum dot of claim 1, wherein the first thiol compound does not comprise a carboxylic acid moiety and the second thiol compound does not comprise a carboxylic acid moiety.

11. The quantum dot of claim 1, wherein the quantum dot further comprises a third ligand derived from RC(=O)OH, RC(=O)OM', $RNH_2$, $R_2NH$, $R_3N$, $R_3PO$, $R_3P$, ROH, RP(=O)(OH)$_2$, $R_2P$(=O)OH, wherein, each R is independently a substituted or unsubstituted C5 to C24 alkyl group, a substituted or unsubstituted C5 to C24 alkenyl group, or a substituted or unsubstituted C5 to C20 aryl group, and M' is a monovalent metal, or a combination thereof, and the third ligand is present in an amount of less than about 5 weight percent, based on a total weight of the quantum dot.

12. The quantum dot of claim 11, wherein in the quantum dot, the amount of the third ligand is less than or equal to about 1 weight percent, based on a total weight of the quantum dot.

13. The quantum dot of claim 1, wherein a total amount of an organic substance present in the quantum dot is less than about 15 weight percent, as measured by a thermogravimetric analysis.

14. The quantum dot of claim 1, wherein the quantum dot further comprises a polyvalent metal compound or a moiety derived therefrom on a surface of the quantum dot.

15. The quantum dot of claim 14, wherein the polyvalent metal compound comprises zinc, indium, or a combination thereof.

16. The quantum dot of claim 14, wherein the polyvalent metal compound comprises a (meth)acrylate moiety, RCOO—, wherein R is a C10 or less aliphatic hydrocarbon group, a halide, or a combination thereof.

17. The quantum dot of claim 14, wherein the polyvalent metal compound comprises zinc chloride, zinc bromide, zinc iodide, indium chloride, zinc(meth)acrylate, zinc propinonate, or a combination thereof.

18. A light emitting device comprising
a first electrode and a second electrode facing each other; and
an emission layer disposed between the first electrode and the second electrode, the emission layer comprising the quantum dot according to claim 1.

19. The light emitting device of claim 18, wherein the light emitting device further comprises a hole injecting layer, a hole transport layer, an electron blocking layer, or a combination thereof between the first electrode and the emission layer.

20. The light emitting device of claim 18, wherein the light emitting device further comprises an electron injecting layer, an electron transport layer, a hole blocking layer, or a combination thereof between the second electrode and the emission layer.

21. A display device comprising the light emitting device of claim 18.

* * * * *